(12) United States Patent
Okada et al.

(10) Patent No.: US 7,556,892 B2
(45) Date of Patent: Jul. 7, 2009

(54) HALFTONE PHASE SHIFT MASK BLANK, HALFTONE PHASE SHIFT MASK, AND PATTERN TRANSFER METHOD

(75) Inventors: Kimihiro Okada, Tokyo (JP); Masahide Iwakata, Tokyo (JP); Takashi Haraguchi, Tokyo (JP); Mikio Takagi, Tokyo (JP); Yuichi Fukushima, Tokyo (JP); Hiroki Yoshikawa, Joetsu (JP); Toshinobu Ishihara, Joetsu (JP); Satoshi Okazaki, Joetsu (JP); Yukio Inazuki, Joetsu (JP); Tadashi Saga, Tokyo (JP)

(73) Assignees: Shin-Etsu Chemical Co., Ltd., Tokyo (JP); Toppan Printing Co., Ltd., Tokyo (JP)

( * ) Notice: Subject to any disclaimer, the term of this patent is extended or adjusted under 35 U.S.C. 154(b) by 1020 days.

(21) Appl. No.: 11/093,295

(22) Filed: Mar. 30, 2005

(65) Prior Publication Data
US 2005/0244722 A1   Nov. 3, 2005

(30) Foreign Application Priority Data

| Mar. 31, 2004 | (JP) | ............................. 2004-102219 |
| Mar. 31, 2004 | (JP) | ............................. 2004-102388 |
| Mar. 31, 2004 | (JP) | ............................. 2004-102427 |

(51) Int. Cl.
*G03F 1/00* (2006.01)
(52) U.S. Cl. ........................................................... 430/5
(58) Field of Classification Search ....................... 430/5
See application file for complete search history.

(56) References Cited

U.S. PATENT DOCUMENTS

| 5,482,799 | A | 1/1996 | Isao et al. |
| 5,538,816 | A * | 7/1996 | Hashimoto et al. ............. 430/5 |
| 5,897,977 | A | 4/1999 | Carcia et al. |
| 6,335,124 | B1 | 1/2002 | Mitsui et al. |
| 6,395,434 | B1 | 5/2002 | Nozawa et al. |
| 6,743,553 | B2 | 6/2004 | Shiota et al. |
| 7,115,341 | B2 | 10/2006 | Shiota et al. |
| 7,166,392 | B2 | 1/2007 | Ushida et al. |
| 7,329,474 | B2 | 2/2008 | Yoshikawa et al. |
| 7,351,505 | B2 * | 4/2008 | Yoshikawa et al. ............. 430/5 |
| 2003/0180631 | A1 | 9/2003 | Shiota et al. |

(Continued)

FOREIGN PATENT DOCUMENTS

EP    0 838 726 A1   4/1998

(Continued)

*Primary Examiner*—Mark F Huff
*Assistant Examiner*—Stewart A Fraser
(74) *Attorney, Agent, or Firm*—Birch, Stewart, Kolasch & Birch, LLP

(57) ABSTRACT

In a halftone phase shift mask blank comprising a substrate, a light absorbing film, and a phase shifter film, the light absorbing film contains a metal element of Group 4A in a distribution having a higher metal element content in an upper region than in a lower region. Also provided is a halftone phase shift mask blank comprising a transparent substrate and a halftone phase shift film of a single layer or multiple layers having a preselected phase difference and transmittance, wherein at least one layer of the halftone phase shift film contains at least 90 atom % of silicon and a plurality of metal elements, typically Mo and Zr or Hf.

28 Claims, 13 Drawing Sheets

U.S. PATENT DOCUMENTS

| | | |
|---|---|---|
| 2003/0219654 A1 | 11/2003 | Ushida et al. |
| 2004/0053026 A1 | 3/2004 | Angelopoulos et al. |
| 2004/0058254 A1 | 3/2004 | Nozawa et al. |
| 2004/0086788 A1 * | 5/2004 | Shiota et al. .................... 430/5 |

FOREIGN PATENT DOCUMENTS

| | | |
|---|---|---|
| EP | 0 924 567 A1 | 6/1999 |
| JP | 02-242252 A | 9/1990 |
| JP | 4-136854 A | 5/1992 |
| JP | 7-140635 A | 6/1995 |
| JP | 7-168343 A | 7/1995 |
| JP | 2000-181049 A | 6/2000 |
| JP | 2000-250196 A | 9/2000 |
| JP | 2002-258460 A | 9/2002 |
| JP | 2003-287872 A | 10/2003 |
| JP | 2003-322954 A | 11/2003 |
| JP | 2004-085760 A | 3/2004 |
| JP | 2004-318087 A | 11/2004 |
| WO | WO-94/11786 A1 | 5/1994 |

* cited by examiner

FIG.1A
PRIOR ART
FIG.1B
PRIOR ART
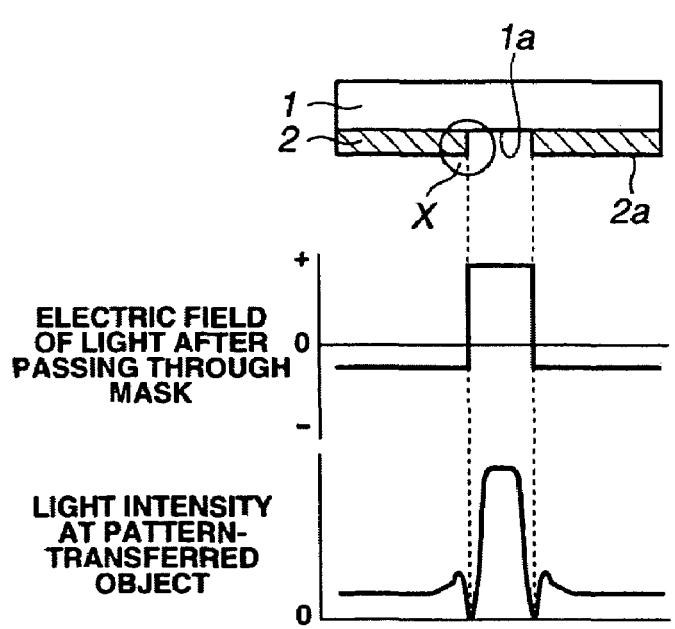
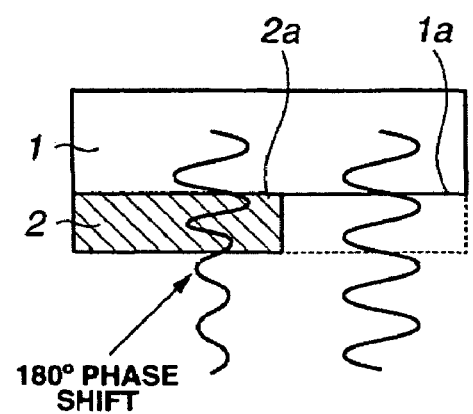

US 7,556,892 B2

HALFTONE PHASE SHIFT MASK BLANK, HALFTONE PHASE SHIFT MASK, AND PATTERN TRANSFER METHOD

CROSS-REFERENCE TO RELATED APPLICATION

This non-provisional application claims priority under 35 U.S.C. §119(a) on Patent Application Nos. 2004-102219, 2004-102388 and 2004-102427 filed in Japan on Mar. 31, 2004, Mar. 31, 2004 and Mar. 31, 2004, respectively, the entire contents of which are hereby incorporated by reference.

TECHNICAL FIELD

This invention relates to a halftone phase shift mask for use in the photolithographic fabrication of semiconductor integrated circuits or the like and effective for phase shifting and attenuation of exposure light. More particularly, it relates to a halftone phase shift mask blank, a halftone phase shift mask obtained therefrom, and a pattern transfer method using the mask.

BACKGROUND ART

Photomasks are used in a wide variety of applications including the fabrication of semiconductor integrated circuits such as ICs, LSIs and VLSIs. Basically, the photomask is prepared from a photomask blank having a chromium based light-shielding film on a transparent substrate, by forming a predetermined pattern in the light-shielding film by photolithography using UV or electron beams. The current demand for a higher level of integration in the semiconductor integrated circuit market has created a need for a smaller feature size. The traditional solutions are by reducing the wavelength of exposure light and increasing the numerical aperture of lens.

However, since reducing the wavelength of exposure light increases the expenses of equipment and material, it is recommended to avoid such a choice. Increasing the numerical aperture improves resolution at the sacrifice of focal depth, which lowers the process stability and adversely affects the manufacture yield of products. One effective pattern transfer method for solving these problems is a phase shift method. A phase shift mask is used as a mask for transferring a micropattern.

Referring to FIGS. 1A and 1B, a phase shift mask, specifically a halftone phase shift mask is illustrated as comprising a substrate 1 and a phase shifter film 2 deposited thereon. The mask consists of a phase shifter 2a that forms a pattern on the substrate and an uncovered area 1a of the substrate 1 that is exposed where the phase shifter 2a is absent. A phase difference of about 180° is set between the light transmitted by the uncovered substrate area 1a and the light transmitted by the phase shifter 2a. Due to light interference at the pattern boundary, the light intensity at the interfering boundary becomes zero, improving the contrast of a transferred image. The phase shift method permits to increase the focal depth for acquiring the desired resolution. This achieves improvements in resolution and exposure process margin, as compared with conventional masks having ordinary light-shielding patterns in the form of chromium film.

Depending on the light transmission of phase shifter, the phase shift masks are generally divided for practical application into full transmission type phase shift masks and halftone type phase shift masks. The full transmission type phase shift masks are transparent to the exposure light wavelength because the light transmittance of the phase shifter section is equal to the light transmittance of uncovered substrate areas. In the halftone type phase shift masks, the light transmittance of the phase shifter section is several percents to several tens of percents of the light transmittance of uncovered substrate areas.

One example of early announced halftone phase shift masks is a multilayer halftone phase shift mask as disclosed in JP-A 4-136854. As shown in FIG. 2, a phase shift film 2 including a metal thin film 3 for controlling transmittance and a transparent film 4 having a sufficient thickness to induce a 180° phase shift to the light transmitted thereby is formed on a transparent substrate 1.

The mainstream intended for commercial application resides in single-layer halftone phase shift masks which are of simpler construction and ensure a precision in the manufacture of photomask blanks and processing into photomasks. As shown in FIG. 3, one known single-layer halftone phase shift mask has a phase shift film 2 (or semi-transmissive film 5) of MoSi base materials such as MoSiO or MoSiON (see JP-A 7-140635). The single-layer halftone phase shift mask is an effective means for accomplishing a high resolution in a simple manner. However, as the light used for exposure becomes of shorter wavelength, a problem arises in mask defect inspection or the like.

Oxynitride films of metal and silicon having a relatively high oxygen or nitrogen content are commonly used as the semi-transmissive film 5 of single-layer halftone phase shift mask blank. They have the nature that their transmittance becomes higher as the wavelength of irradiating light becomes longer. On the other hand, after a semiconductor circuit pattern is written in the blank, the resulting mask must be inspected for defects. The defect inspection system uses light having a longer wavelength than that of a light source for exposure used in the lithography through that mask. For a mask adapted to an ArF excimer laser with an exposure wavelength of 193 nm, for example, the defect inspection system generally uses a wavelength of near 260 nm, typically 266 nm, which is longer than the exposure wavelength 193 nm. For effective defect inspection, a contrast must exist between the uncovered substrate area and the phase shifter. Nevertheless, particularly when the single-layer film is adjusted to a transmittance for an exposure wavelength of 200 nm or shorter, the halftone phase shifter has a considerably high transmittance to the inspection wavelength, preventing defect inspection at a sufficient precision. The problem arising from the difference between inspection wavelength and exposure wavelength is noticed not only in terms of transmittance, but also in terms of reflectance.

It is then desired for a halftone phase shift film to have minimal dependence of transmittance and reflectance on wavelength. One solution to this problem is to construct the halftone phase shift film to a multilayer structure, specifically a halftone phase shift film 2 of the structure in which a film 7 having a phase shift function (typically a silicon oxide and/or nitride film containing a metal) is combined with a metal film 6 having a light absorbing function, as shown in FIG. 4 (see JP-A 7-168343).

Such a halftone phase shift mask is manufactured from a blank comprising a metal film, a phase shift film and a light-shielding film on a transparent substrate, by forming a photoresist film on the blank, patterning the photoresist film, and dry etching the light-shielding film through the resist pattern for transferring the pattern to the light-shielding film. A dry etching technique using a chlorine-based gas is often selected at this etching stage since the light-shielding film is typically formed of a chromium-based material. Then, using the mask pattern transferred to the resist and the light-shielding film as an etching mask, dry etching is performed for transferring the pattern to the phase shift film. A dry etching technique using a fluorine-based gas is selected at the second etching stage since the phase shift film is typically formed of a metal-containing silicon oxide and/or nitride. Subsequent etching is performed on the metal film, completing the pattern transfer to all the layers of the halftone phase shift film. If the etching away of the metal film, which largely affects transmittance, is insufficient, it is impossible to manufacture a mask as designed. On the other hand, an attempt to remove the metal film completely often forces etching into the transparent substrate, which fails to provide a phase difference as designed and hence, a phase shift effect as expected.

In order to perform precise etching of the metal film without causing any damage to the underlying substrate, it is preferred to select an etch-susceptible material as the metal film. However, since the metal film is considerably thin, a choice of an extremely etch-susceptible material may allow the etching of the phase shift film to give damages to the substrate past the metal film. Since the transparent substrate used generally has a relatively high etching rate with respect to the fluorine-based gas used for the etching of the phase shift film, it can be readily damaged if over-etching occurs such that the metal film is completely removed during the etching of the phase shift film.

It is then a common practice to prevent over-etching to the substrate by selecting a material which is resistant to etching with fluorine-based gas for the metal film so that the etching of the phase shift film terminates at the metal film, and selecting a chlorine-based gas as the conditions for etching of the metal film. However, the management of these etching steps is actually very difficult.

For achieving a higher degree of integration, the pattern size of semiconductor integrated circuits becomes finer and finer. The lithographic light source of a stepper (stepping projection aligner) or scanner for transferring the mask pattern to wafers has undergone a transition to a shorter wavelength region than KrF excimer laser (248 nm) and ArF excimer laser (193 nm), with the use of $F_2$ laser (157 nm) being under investigation. Among the photomasks used in the fabrication of semiconductor integrated circuits, phase shift masks are currently on predominant use as the photomask capable of reducing the pattern size. For a further reduction of the pattern size, research works are being made to develop a phase shift mask capable of accommodating exposure light of shorter wavelength.

For such phase shift masks, especially halftone phase shift masks that shift the phase of exposure light transmitted by and attenuate the exposure light transmitted by, the constituent elements, composition, film thickness, layer arrangement and the like of the phase shift film must be selected such as to provide a desired phase difference and transmittance at the short wavelength of exposure light used, for example, the wavelength (157 nm) of $F_2$ laser.

However, if one attempts to acquire a phase difference and transmittance compatible with such shorter wavelength exposure light using the constituent elements of conventional halftone phase shift films used at ordinary wavelengths longer than the $F_2$ laser (157 nm), many characteristics of the resultant halftone phase shift film, for example, etching behavior, etching rate, electroconductivity (sheet resistance), chemical resistance, and transmittance at the inspection wavelength are altered from those at the ordinary wavelengths.

For example, some halftone phase shift films for $F_2$ laser (157 nm) exposure gain a transmittance at the exposure wavelength by resorting to a technique of providing a higher degree of oxidation, such as by increasing the content of oxygen in a film beyond the oxygen level in conventional halftone phase shift films for the ArF excimer laser exposure. Of these, halftone phase shift films of MoSi system, for example, suffer from the problem that the resistance of oxide film to chemical liquid, especially alkaline liquid is unsatisfactory.

It would be desirable to develop a halftone phase shift film that satisfies a phase difference and transmittance upon exposure to shorter wavelength light and that fully clears at a practical level the characteristics required in an overall process from the manufacture of a halftone phase shift mask from a halftone phase shift mask blank to the pattern transfer using the mask.

SUMMARY OF THE INVENTION

A first object of the invention is to provide a phase shift mask blank which can be easily processed at a higher precision into a multilayer-structure halftone phase shift mask having a desired transmittance, reflectance and phase; a phase shift mask prepared therefrom; and a pattern transferring method.

A second object of the invention is to provide a halftone phase shift mask blank comprising a halftone phase shift film that satisfies a phase difference and transmittance upon exposure to shorter wavelength light, typically $F_2$ laser (157 nm) and that fully clears at a practical level the characteristics required in an overall process from the manufacture of a halftone phase shift mask to the pattern transfer using the mask, such as etching behavior, etching rate, conductivity (sheet resistance), chemical resistance and transmittance at the inspection wavelength; a phase shift mask prepared therefrom; and a pattern transferring method.

[1] In connection with a halftone phase shift mask of multilayer structure comprising a transparent substrate, a film having a main function of light absorption on the substrate, and a film having a main function of phase shift on the light absorbing function film, the inventor has found that the first object is attained when the light absorbing function film of the multiple films on a photomask blank used for its manufacture contains a metal element of Group 4A which is resistant to etching and the concentration of the metal element in the light absorbing function film is higher at a side adjacent the phase shift function film than at a side adjacent the substrate. Then, the optical properties required for the light absorbing function film are met, the light absorbing function film is readily detected during the etching step in processing of the film, and the possibility that a shortage of etching selectivity ratio near the end of processing of the light absorbing function film allows over-etching to occur so that the substrate is seriously damaged is mitigated.

The first aspect of the present invention that attains the first object provides a phase shift mask blank, a phase shift mask and a pattern transferring method, as defined below.

(1) A halftone phase shift mask blank of multilayer structure comprising a substrate, a film having a main function of light absorption on the substrate, and a film of at least one layer having a main function of phase shift on the light absorbing function film, wherein said light absorbing function film includes an upper region adjacent the phase shift function film and a lower region adjacent the substrate and contains a metal element of Group 4A in such a distribution that the light absorbing function film has a higher metal element content in the upper region than in the lower region.

(2) The halftone phase shift mask blank of (1), wherein the metal element of Group 4A is zirconium and/or hafnium.

(3) The halftone phase shift mask blank of (1), wherein the light absorbing function film further comprises at least one metal element other than the metal element of Group 4A.

(4) The halftone phase shift mask blank of (3), wherein the metal element other than the metal element of Group 4A is molybdenum and/or tantalum.

(5) The halftone phase shift mask blank of (1), wherein the light absorbing function film further comprises silicon.

(6) The halftone phase shift mask blank of (5), wherein the light absorbing function film further comprises oxygen, nitrogen, or oxygen and nitrogen.

(7) The halftone phase shift mask blank of (1), further comprising a second light absorbing film intervening in the phase shift function film, said second film being of a material which is identical with or different from the light absorbing function film.

(8) A phase shift mask obtained by patterning the phase shift mask blank of (1).

(9) A pattern transfer method using the phase shift mask of (8).

When the phase shift mask blank of the first aspect is processed into a phase shift mask, there is involved a dry etching step. Since the light absorbing function film is readily detected and a distinct selectivity relative to the substrate is insured during the etching step, a high precision of processing is possible. Then a mask having a precisely controlled transmittance and phase shift quantity is obtained. In the photolithography using the mask, a greater focal depth is insured.

[2] In connection with a halftone phase shift mask blank comprising a substrate which is transparent to exposure light and a halftone phase shift film thereon having a preselected phase difference and transmittance, the halftone phase shift film being composed of a single layer or multiple layers, the inventor has found that the second object is attained when at least one layer of the halftone phase shift film comprises silicon and a plurality of metal elements as constituent elements, the content of silicon is at least 90 atom % based on the total of silicon and metal elements, preferably the plurality of metal elements are a first metal component of molybdenum and a second metal component of zirconium, hafnium or both, and more preferably an atomic ratio of first metal component to second metal component is up to 5; and the inventor has found that the second object is also attained when at least one layer of the halftone phase shift film comprises silicon and a plurality of metal elements as constituent elements, the content of silicon is at least 95 atom % based on the total of silicon and metal elements, the plurality of metal elements include a first metal component of molybdenum and a second metal component of zirconium, hafnium or both, and an atomic ratio of the first metal component to the second metal component is up to 6.

[3] In connection with a halftone phase shift mask blank comprising a substrate which is transparent to exposure light and a halftone phase shift film thereon having a preselected phase difference and transmittance, the inventor has found that the second object is also attained when the halftone phase shift film has a multilayer structure including in alternate formation at least one light-shielding layer for mainly adjusting transmittance and at least one transparent layer for mainly adjusting phase difference, with the outermost surface layer being a transparent layer, and the light-shielding layer, preferably both the lo light-shielding layer and the transparent layer, comprises silicon, a first metal component of molybdenum, and a second metal component of zirconium or hafnium or both, as constituent elements.

The resulting halftone phase shift mask blank satisfies a phase difference and transmittance upon exposure to shorter wavelength light, typically $F_2$ laser (157 nm) and fully clears at a practical level the characteristics required in an overall process from the manufacture of a halftone phase shift mask to the pattern transfer using the mask, such as etching behavior, etching rate, conductivity (sheet resistance), chemical resistance and transmittance at the inspection wavelength. From the blank, a halftone phase shift mask is obtained which is effective in a lithographic process involving exposure to short wavelength light, typically $F_2$ laser (157 nm).

The second aspect of the present invention that attains the second object provides a halftone phase shift mask blank, a halftone phase shift mask and a pattern transferring method, as defined below.

(10) A halftone phase shift mask blank comprising a substrate which is transparent to exposure light and a halftone phase shift film thereon having a preselected phase difference and transmittance, said halftone phase shift film being composed of a single layer or multiple layers, wherein
at least one layer of said halftone phase shift film comprises silicon and a plurality of metal elements as constituent elements, the content of silicon being at least 90 atom % based on the total of silicon and metal elements.

(11) The halftone phase shift mask blank of (10), wherein the plurality of metal elements include a first metal component of molybdenum and a second metal component of zirconium or hafnium or both.

(12) The halftone phase shift mask blank of (11), wherein an atomic ratio of the first metal component to the second metal component is up to 5.

(13) The halftone phase shift mask blank of (12), wherein the contents of silicon, the first metal component and the second metal component are 90 to 99 atom %, up to 8.3 atom %, and at least 0.15 atom %, respectively, based on the total of silicon and the first and second metal components, provided that the total is 100 atom %.

(14) The halftone phase shift mask blank of (10), wherein said at least one layer comprising silicon and a plurality of metal elements further comprises at least one element selected from the group consisting of hydrogen, oxygen, nitrogen, carbon and halogen, as a constituent element.

(15) A halftone phase shift mask adapted for KrF excimer laser, ArF excimer laser or $F_2$ laser exposure, the mask being obtained by patterning the halftone phase shift film in the phase shift mask blank of (10).

(16) A pattern transfer method comprising exposing a photoresist to a pattern of light through the halftone phase shift mask of (15).

(17) A halftone phase shift mask blank comprising a substrate which is transparent to exposure light and a halftone phase shift film thereon having a preselected phase difference and transmittance, said halftone phase shift film being composed of a single layer or multiple layers, wherein
at least one layer of said halftone phase shift film comprises silicon and a plurality of metal elements as constituent elements, the content of silicon is at least 95 atom % based on the total of silicon and metal elements, the plurality of metal elements include a first metal component of molybdenum and a second metal component of zirconium, hafnium or both, and an atomic ratio of the first metal component to the second metal component is up to 6.

(18) The halftone phase shift mask blank of (17), wherein the contents of silicon, the first metal component and the second metal component are 95 to 99 atom %, up to 4.3 atom %, and at least 0.15 atom %, respectively, based on the total of silicon and the first and second metal components, provided that the total is 100 atom %.
(19) The halftone phase shift mask blank of (17), wherein said at least one layer comprising silicon and a plurality of metal elements further comprises at least one element selected from the group consisting of hydrogen, oxygen, nitrogen, carbon and halogen, as a constituent element.
(20) A halftone phase shift mask adapted for KrF excimer laser, ArF excimer laser or $F_2$ laser exposure, the mask being obtained by patterning the halftone phase shift film in the phase shift mask blank of (17).
(21) A pattern transfer method comprising exposing a photoresist to a pattern of light through the halftone phase shift mask of (20).

The third aspect of the present invention that also attains the second object provides a phase shift mask blank, a phase shift mask and a pattern transferring method, as defined below.

(22) A halftone phase shift mask blank comprising a substrate which is transparent to exposure light and a halftone phase shift film thereon having a preselected phase difference and transmittance, wherein
said halftone phase shift film has a multilayer structure including in alternate formation at least one light-shielding layer for mainly adjusting transmittance and at least one transparent layer for mainly adjusting phase difference, with the outermost surface layer being a transparent layer,
said light-shielding layer comprising silicon, a first metal component of molybdenum, and a second metal component of zirconium or hafnium or both, as constituent elements.
(23) The halftone phase shift mask blank of (22), wherein said transparent layer comprises silicon, the first metal component, and the second metal component as constituent elements.
(24) The halftone phase shift mask blank of (23), wherein the multiple layers of the halftone phase shift film are laid up such that an atomic ratio of the sum of first and second metal components to silicon decreases from a side adjacent the substrate toward a side remote from the substrate.
(25) The halftone phase shift mask blank of (23), wherein the multiple layers of the halftone phase shift film each further comprise a light element component of oxygen or nitrogen or both and are laid up such that an atomic ratio of the light element component to the sum of silicon, first and second metal components, and light element component increases from a side adjacent the substrate toward a side remote from the substrate.
(26) The halftone phase shift mask blank of (22), wherein the multiple layers of the halftone phase shift film are laid up such that the extinction coefficient of the layers decreases from a side adjacent the substrate toward a side remote from the substrate.
(27) The halftone phase shift mask blank of (22), wherein the multiple layers of the halftone phase shift film are laid up such that the electric conductivity of the layers decreases from a side adjacent the substrate toward a side remote from the substrate.
(28) The halftone phase shift mask blank of (22), wherein the multiple layers of the halftone phase shift film are laid up such that the etching rate with fluorine-based gas of the layers increases from a side adjacent the substrate toward a side remote from the substrate and the etching rate with chlorine-based gas of the layers decreases from a side adjacent the substrate toward a side remote from the substrate.
(29) A halftone phase shift mask adapted for KrF excimer laser, ArF excimer laser or $F_2$ laser exposure, the mask being obtained by patterning the halftone phase shift film in the phase shift mask blank of (22).
(30) A pattern transfer method comprising exposing a photoresist to a pattern of light through the halftone phase shift mask of (29).

The halftone phase shift mask blanks and halftone phase shift masks of the second and third aspects satisfy a phase difference and transmittance upon exposure to shorter wavelength light, typically $F_2$ laser (157 nm) and fully clear at a practical level the characteristics required in an overall process from the manufacture of a halftone phase shift mask to the pattern transfer using the mask, such as etching behavior, etching rate, conductivity (sheet resistance), chemical resistance and transmittance at the inspection wavelength. The masks enable effective pattern exposure using short wavelength light, typically $F_2$ laser (157 nm).

BRIEF DESCRIPTION OF THE DRAWINGS

The above and other features and advantages of the invention will be more fully understood by reading the following description, taken in conjunction with the accompanying drawings.

FIGS. 1A and 1B illustrate the operating principle of a halftone phase shift mask. FIG. 1B is an enlarged view of region X in FIG. 1A.

FIG. 15 illustrates in sectional view the method of manufacturing a halftone phase shift mask in the second embodiment of the invention.

FIG. 18 illustrates in sectional view the method of manufacturing a halftone phase shift mask in the third embodiment of the invention.

DESCRIPTION OF THE PREFERRED EMBODIMENT

In a structure including a substrate, an intermediate layer lying on the substrate and a top layer lying on the intermediate layer, the intermediate layer includes an upper region disposed adjacent the top layer and a lower region disposed adjacent the substrate. Also the intermediate layer has a lower side (or surface) disposed adjacent the substrate and an upper side (or surface) disposed remote from the substrate, which are referred to as "substrate side" and "remote side," respectively. The terms "lower" and "upper" are used only for convenience sake, but in no way for limitation.

First Embodiment

First described are the halftone phase shift mask blank, halftone phase shift mask and pattern transfer method in the first embodiment of the present invention.

Figure 2:
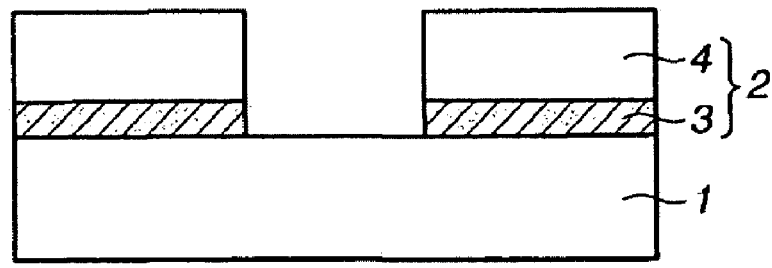
FIG. 2 is a cross-sectional view of an exemplary prior art halftone phase shift mask comprising a metal film and a transparent film.
Figure 3:
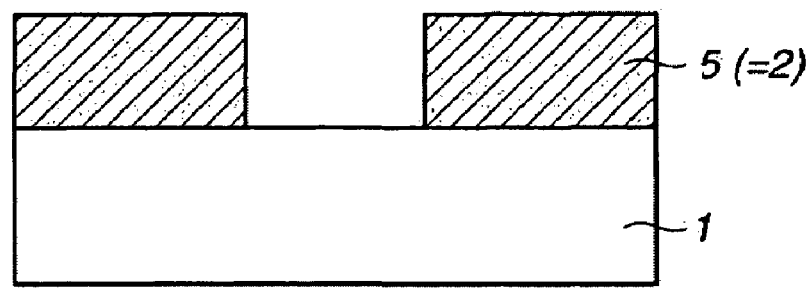
FIG. 3 is a cross-sectional view of an exemplary prior art halftone phase shift mask comprising a single layer film.
Figure 4:
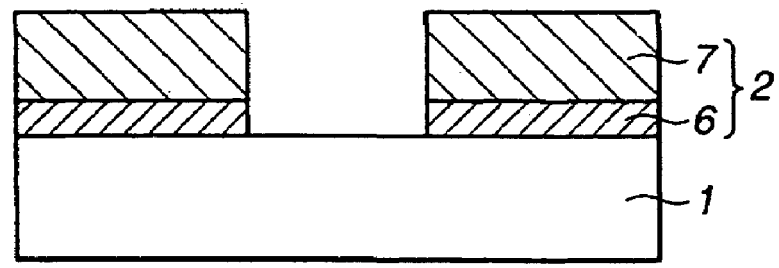
FIG. 4 is a cross-sectional view of an exemplary prior art halftone phase shift mask comprising a metal film having a light absorbing function and a phase shift function film.
Figure 5:
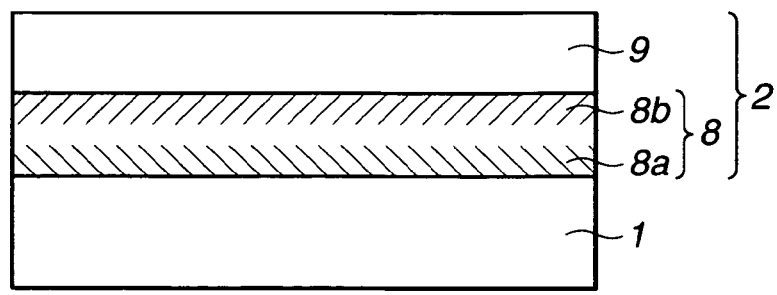
FIG. 5 is a cross-sectional view of an exemplary halftone phase shift mask blank of the simplest structure in the first embodiment of the invention.
Figure 6:
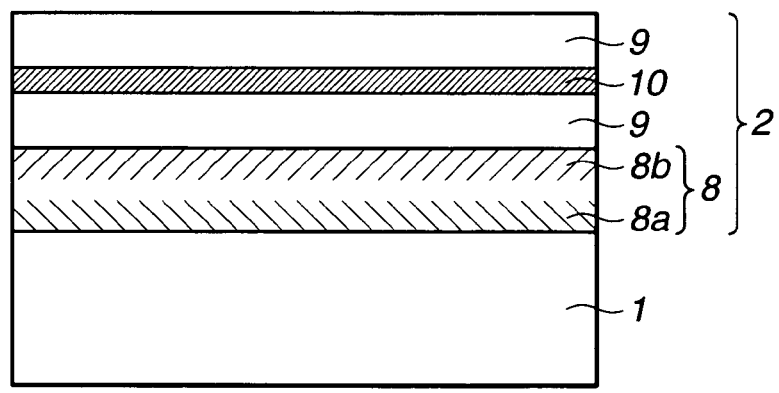
FIG. 6 is a cross-sectional view of another exemplary halftone phase shift mask blank in the first embodiment of the invention.
Figure 7:
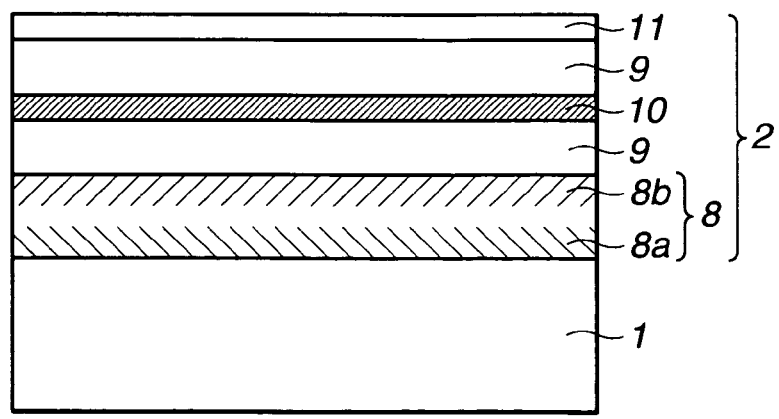
FIG. 7 is a cross-sectional view of a further exemplary halftone phase shift mask blank in the first embodiment of the invention.
Figure 8:
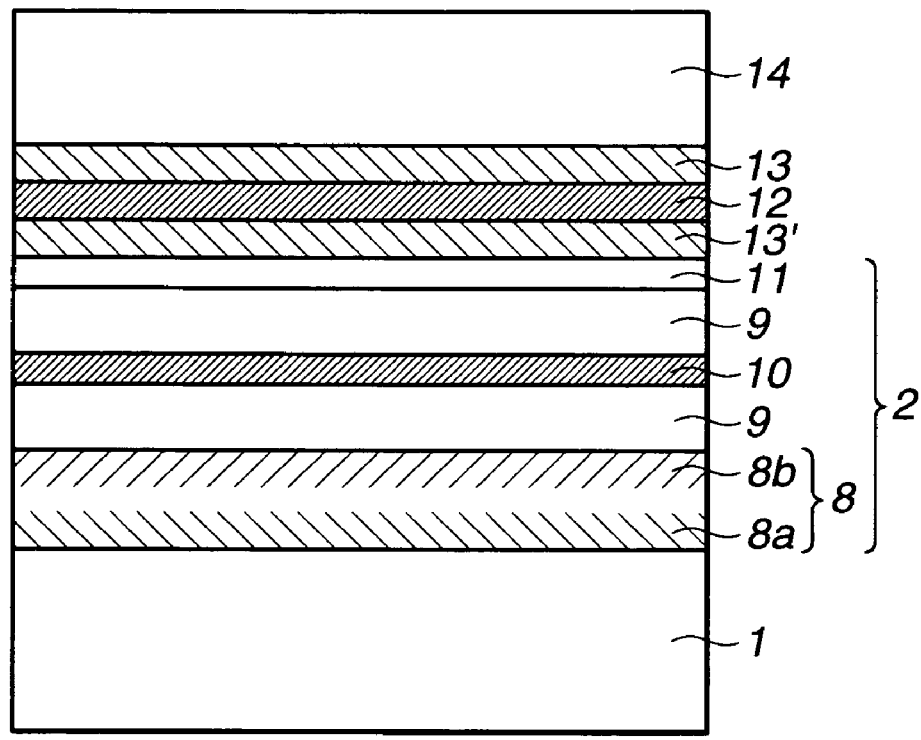
FIG. 8 is a cross-sectional view of a still further exemplary halftone phase shift mask blank in the first embodiment of the invention.

As shown in FIGS. 5 to 8, the phase shift mask blank in the first embodiment of the invention comprises a transparent substrate 1 of polished quartz or $CaF_2$ and a multilayer phase shift film 2 lying thereon for attenuating the light transmitted thereby and shifting its phase by approximately 180°. The multilayer phase shift film 2 includes a film 8 having a main function of light absorption on the substrate 1 and a film 9 having a main function of phase shift on the film 8. In the description of the first embodiment, these films are referred to as light absorbing film 8 and phase shifter film 9, respectively, and the multilayer film as a whole is referred to as multilayer phase shift film 2. To tailor a transmittance and reflectance more appropriate for inspection, a structure in which a second light absorbing film 10 intervenes in the phase shifter film 9 as shown in FIG. 6 is preferred. The material of which the second light absorbing film 10 is made may be identical with or different from the light absorbing film 8 on the substrate 1. A further structure in which a film having high chemical resistance (chemical resistant layer) 11 is formed on the phase shifter film 9 as shown in FIG. 7 ensures better physical properties during the final step of cleaning the mask with chemical liquid. Typically, a light-shielding film 12 of chromium compound is further formed on the multilayer phase shift film 2 as shown in FIG. 8. It serves as an electroconductive film during irradiation of electron beams for mask processing and eventually as a light-shielding film over the frame portion or, in the case of a tri-tone type halftone phase shift mask, as a light-shielding film on the center portion of a micro-pattern.

In the first embodiment, the light absorbing film 8 typically contains a metal element other than Group 4A, or a metal element other than Group 4A, and silicon, or an unsaturated metal compound having a metal element of Group 4A added thereto. Examples of the metal element other than Group 4A include transition metals and lanthanoids alone or in admixture, preferably molybdenum, tungsten, tantalum and chromium, and more preferably molybdenum and tantalum. The concentration of Group 4A metal element in the light absorbing film 8 is controlled such that the concentration in a lower region 8a adjacent the substrate 1 is zero or lower than in an upper region 8b adjacent the phase shifter film 9. The preferred Group 4A metal elements are zirconium and hafnium.

The addition of silicon to the light absorbing film 8 is determined depending on whether the light absorbing film 8 and the phase shifter film 9 are etched under identical conditions or separately in two stages. When the method involving two separate stages of etching is selected, only a little or no silicon is added to the light absorbing film 8 in order to enhance its resistance to etching with fluorine-based gas. In order to enable etching of the two layers under identical conditions, on the other hand, it is advantageous that a relatively large proportion of silicon is contained in the light absorbing film 8 or an unsaturated metal compound is selected so that the film may have a high rate of etching with fluorine-based gas.

Reference is made to the unsaturated metal compound which is one of the materials selected for the light absorbing film 8. The "stoichiometry" refers to a compound in which constituent elements assume typical valence numbers so as to provide an exact balance of electric charges. The metal compound having elements in such a constitution ratio is referred to as "saturated metal compound." Of exemplary metals, molybdenum Mo is hexa-valent ($6^+$), zirconium Zr is tetra-valent ($4^+$), tantalum Ta is penta-valent ($5^+$), chromium Cr is tri-valent ($3^+$), hafnium Hf is tetra-valent ($4^+$), and silicon Si is tetra-valent ($4^+$). Of light elements, oxygen (O) is di-valent ($2^-$), nitrogen (N) is tri-valent ($3^-$), and carbon is tetra-valent ($4^-$). Specifically, in the case of an oxide containing molybdenum and silicon in a ratio of 1:2, the stoichiometric composition is $MoSi_2O_7$; and in the case of a nitride containing molybdenum and silicon in a ratio of 1:1, the stoichiometric composition is $MoSiN_{10/3}$.

By contrast, a metal compound in which the contents of light elements, i.e., oxygen, nitrogen and carbon are lower than the stoichiometry so that the apparent electric charge balance determined by the valence numbers is thrown off is referred to as "unsaturated metal compound." Specifically, in the case of oxides containing molybdenum and silicon in a ratio of 1:2, those compounds having the average composition: $MoSi2O_{7-a}$ wherein a is a positive number of $0<a<7$ are unsaturated metal compounds; and in the case of nitrides containing molybdenum and silicon in a ratio of 1:1, those compounds having the average composition: $MoSiN_{(10/3)-b}$ wherein b is a positive number of $0<b<10/3$ are unsaturated metal compounds.

Although the reduced content of light element tips the apparent electric charge balance as mentioned above, a balance of electric charges is actually kept by virtue of generation of positive electric charges like holes and a change of metal valence number (e.g., the valence number of Mo changes from hexa-valence ($6^+$) to tri-valence ($3^+$)).

Preferred examples of the unsaturated metal compound of which the light absorbing film is formed include unsaturated metal silicide oxides, unsaturated metal silicide oxynitrides, and unsaturated metal silicide oxynitride carbides. As to their composition, preferably the unsaturated metal silicide oxides consist essentially of 0.2 to 80 atom % of M, 19 to 90 atom % of Si and 0.1 to 60 atom % of O; the unsaturated metal silicide oxynitrides consist essentially of 0.2 to 80 atom % of M, 19 to 90 atom % of Si, 0.1 to 50 atom % of O and 0.1 to 50 atom % of N; and the unsaturated metal silicide oxynitride carbides consist essentially of 0.2 to 80 atom % of M, 19 to 90 atom % of Si, 0.1 to 45 atom % of O, 0.1 to 45 atom % of N and 0.1 to 30 atom % of C, wherein M is a metal.

Such an unsaturated metal compound may be formed by reactive sputtering using a sputtering gas with an appropriate amount of an oxygen-containing gas, nitrogen-containing gas or carbon-containing gas added thereto. Since the technique of reactive sputtering enables to adjust the compositional ratio of oxygen, nitrogen and carbon as desired, it has advantages of possible adjustment of optical properties and an increased degree of freedom of design.

In the event the blank of the first embodiment employs the method of processing the light absorbing film 8 under the same etching conditions as the phase shifter film 9, silicon is contained in the light absorbing film 8, preferably in an amount of 20 to 90 atom %. The light absorbing film 8 (in case the light absorbing film consists of more than one layer, each layer) has a thickness of up to 15 nm, preferably up to 10 nm, more preferably up to 6 nm, even more preferably up to 2.5 nm, most preferably up to 1.25 nm. The lower limit is typically at least 0.5 nm.

In order to provide the light absorbing film 8 with a graded concentration of Group 4A metal element, at least two different targets must be concurrently used in sputtering. A target containing Group 4A metal element and a target free of Group 4A metal element are furnished. Alternatively, targets having different contents of Group 4A metal element are furnished. The concentration grading is controlled in terms of the powers applied to the targets. For example, in depositing a film on a transparent substrate by sputtering, a consecutive grading of concentration is accomplished by setting high the power applied to the Group 4A metal element-free target or target having a lower concentration of Group 4A metal element and setting zero or low the power applied to the Group 4A metal element-containing target or target having a higher concentration of Group 4A metal element at the initial stage of sputtering and after the start of deposition, reducing with time the power applied to the former target and/or increasing with time the power applied to the latter target. In this way, a light absorbing film having a lower concentration of Group 4A metal element in the substrate-adjacent region 8a and a higher concentration in the shifter-adjacent region 8b is obtained.

Alternatively, a light absorbing film having a lower content of Group 4A metal element in the substrate-adjacent region 8a and a higher content in the shifter-adjacent region 8b is constructed by a multilayer film. The desired multilayer film is prepared by setting high the power applied to the Group 4A metal element-free target or target having a lower concentration of Group 4A metal element and setting zero or low the power applied to the Group 4A metal element-containing target or target having a higher concentration of Group 4A metal element at the start, effecting deposition in this condition for a certain time, then decreasing the power applied to the former target and/or increasing the power applied to the latter target and continuing deposition.

In the latter case where a graded concentration of Group 4A metal element is provided by the multilayer structure, the operation of forming the film becomes complex. Since layers can be deposited one by one, however, the light absorbing film can be deposited even if a single target is used in every sputtering step.

Preferably the concentration of Group 4A metal element is 0 to 40 atom %, especially 0 to 5 atom % in the substrate-adjacent region 8a and 3 to 100 atom %, especially 5 to 95 atom % in the shifter-adjacent region 8b. It is further preferred that the concentration of Group 4A metal element in the shifter-adjacent region 8b is 2 to 100 atom %, especially 5 to 95 atom % higher than in the substrate-adjacent region 8a.

It is preferred for the light absorbing film 8 that the substrate-adjacent region 8a have a thickness of 0.5 to 8 nm, especially 0.5 to 3 nm and the shifter-adjacent region 8b have a thickness of 0.5 to 8 nm, especially 0.5 to 3 nm.

The target used in sputtering may contain a component other than Group 4A metal element which may be selected in accordance with the desired composition of the light absorbing film. Deposition is typically carried out by placing in the system a metal target, a metal silicide target, and optionally a silicon target if the system permits use of more than two targets, and sputtering the targets in an inert gas atmosphere such as neon, argon or krypton. In case the light absorbing film is of an unsaturated metal compound, it may be formed by introducing any of oxygen-, nitrogen- and carbon-containing gases into the sputtering gas and effecting reactive sputtering.

The light absorbing film thus deposited so as to have a higher concentration of Group 4A metal element in the shifter-adjacent region and a lower concentration of Group 4A metal element in the substrate-adjacent region offers the following advantages when a pattern is transferred to the multilayer phase shift film.

In one situation, the multilayer phase shift film is etched in two separate stages. In this case, as described in JP-A 7-168343, the light absorbing film is expected to have a function of etching stop in fluorine-based gas etching. The addition of Group 4A metal element to the light absorbing film is an easy means of enhancing the etching resistance as compared with the absence of such metal element. On the other hand, the content of Group 4A metal element is lower on the transparent substrate-adjacent side than on the shifter film-adjacent side. Then, during the etching under chlorine gas conditions for transferring a pattern to the light absorbing film, the risk of causing damage to the transparent substrate 1 is restrained because the etching selectivity ratio between the transparent substrate 1 and the light absorbing film 8a is low due to the addition of Group 4A metal element.

In the other situation wherein the phase shifter film 9 and the light absorbing film 8 are etched under the same conditions, the process control must be very strictly managed. The addition of Group 4A metal element to the shifter-adjacent region in a higher concentration affords to confirm that etching has reached the light absorbing film. The low concentration of Group 4A metal element in the substrate-adjacent region avoids any inconvenience like reversal of etching selectivity ratio.

In the first embodiment, the phase shifter film 9 is formed of an oxide, nitride, carbide, oxynitride, oxynitride carbide or nitride carbide comprising a metal or a metal and silicon. Preferred are saturated metal compounds of the composition having stoichiometric contents of oxygen, nitrogen and carbon. A phase shifter film formed of a saturated metal compound has the advantage of chemical resistance.

The metal element of which the phase shifter film 9 in the first embodiment is constructed may be any element selected from among transition metals, lanthanoids and combinations thereof. Of these, molybdenum, tantalum, chromium, zirconium and hafnium are preferred, with Mo and Zr being most preferred.

The phase shifter film is preferably formed of metal silicide oxides, metal silicide oxynitrides, or metal silicide oxynitride carbides. As to their composition, it is recommended that the metal silicide oxides consist essentially of 0.2 to 25 atom % of M, 10 to 42 atom % of Si and 30 to 60 atom % of O; the metal silicide oxynitrides consist essentially of 0.2 to 25 atom % of M, 10 to 57 atom % of Si, 2 to 20 atom % of O and 5 to 57 atom % of N; and the metal silicide oxynitride carbides consist essentially of 0.2 to 25 atom % of M, 10 to 57 atom % of Si, 2 to 20 atom % of O, 5 to 57 atom % of N and 0.5 to 30 atom % of C, wherein M is a metal.

The phase shifter film 9 may be formed by placing in the system any of a metal target, a silicon target and a metal silicide target, selected in accordance with the desired composition of the phase shifter film 9, adding any of oxygen-, nitrogen- and carbon-containing gases to an inert gas such as neon, argon or krypton, and effecting reactive sputtering.

In some cases, the phase shifter film 9 can be deposited from the combination of targets used in the deposition of the light absorbing film 8. Once the light absorbing film 8 is deposited, the phase shifter film 9 can be sequentially deposited merely by altering the gas conditions. When film deposition by multiple stages of sputtering is employed, the phase shifter film 9 of a completely different composition than the light absorbing film can be deposited.

In a preferred embodiment (see FIG. 7), a layer 11 (sometimes, referred to as chemical resistant film) containing Group 4A metal element, typically zirconium or hafnium, preferably in a high concentration like the light absorbing film is formed on the upper side of the phase shifter film 9 that is to be adjacent to the light-shielding film. This embodiment is advantageous in that after pattern transfer, it prevents the pattern from being damaged during the removal of the resist film and light-shielding film on the pattern and final cleaning.

As previously described, the second light absorbing film 10 can be formed between upper and lower sections of the phase shifter film 9. Generally, the light absorbing film 8 and the phase shifter film 9 on the transparent substrate need not be deposited continuously. In the embodiment wherein the second light absorbing film 10 is formed intermediate the phase shifter film 9, it is preferred that the phase shifter film 9 and the second light absorbing film 10 be continuously deposited, because the manufacturing process is otherwise complicated. Specifically, during deposition of the phase shifter film 9, the sputtering gas atmosphere is changed to only the inert gas whereby a metal silicide film is deposited as the second light absorbing film 10. Alternatively, the concentration of oxygen and nitrogen is reduced at an intermediate stage whereby an unsaturated metal silicide compound film is deposited as the second light absorbing film 10.

As to the composition of the second light absorbing film 10, it is recommended that the unsaturated metal silicide oxynitrides consist essentially of 0.2 to 80 atom % of M, 19 to 90 atom % of Si, 0.1 to 50 atom % of O and 0.1 to 50 atom % of N; and the unsaturated metal silicide oxides consist essentially of 0.2 to 80 atom % of M, 19 to 90 atom % of Si, and 0.1 to 60 atom % of O, wherein M is a metal.

The composition of the second light absorbing film 10 may be identical with or different from that of the first light absorbing film 8 and may or may not contain the Group 4A metal element.

The interposition of a second light absorbing film within the phase shifter film offers an advantage associated with the repair of opaque defects with laser light. More specifically, sometimes in phase shift masks, defects in the multilayer phase shift film 2 are repaired using laser light. In the multilayer phase shift film 2 of the first embodiment, the light absorbing film 8 is more absorptive to laser energy, but the phase shifter film 9 is less absorptive. Thus, even when the multilayer phase shift film 2 is irradiated with laser light, some parts of the film are not removed, giving rise to a problem of sacrificing the reliability of repair. The interposition of the second light absorbing film 10 within the phase shifter film 9 ensures better repair of defects by laser light because the phase shifter film 9 can be stripped by laser irradiation simultaneous with the removal of the light absorbing film 8, which is more absorptive to laser energy, from the substrate surface even when there is a difference in laser-absorbing capability between the light absorbing film 8 and the phase shifter film 9.

Another advantage results from the interposition of the second light absorbing film 10 within the phase shifter film 9. A certain process of manufacturing a phase shift mask from a phase shift mask blank involves irradiating light having a wavelength of about 550 nm and recognizing a pattern by its reflection. Since the contrast between the uncovered section of the substrate and the phase shifter section is given by a difference of reflectance, it is desired that the phase shifter section (phase shift film) have a reflectance of at least 10%. When the light absorbing film is disposed adjacent the substrate, however, the reflectance in proximity to 550 nm is sometimes reduced below the level of 10% required by the inspector due to the influence of optical interference. In such a case, the interface of the second light absorbing film 10 is preferably located at a depth within 68.75 (137.5/2) nm, more preferably within 34.375 (137.5/4) nm from the top surface of the multilayer phase shift film 2. Then a reflectance of at least 10% in proximity to 550 nm is available.

Preferably, the phase shifter film 9 has a thickness of 10 to 60 nm, more preferably 10 to 30 nm, the second light absorbing film 10 has a thickness of 0.5 to 15 nm, more preferably 0.5 to 1.25 nm, and the chemical resistant layer 11 has a thickness of 1 to 50 nm, more preferably 5 to 20 nm.

In preferred variants of the first embodiment of the invention, a chromium based light-shielding film or a chromium based antireflective film or both are formed on the multilayer phase shift film. The preferred variants include a phase shift mask blank comprising a chromium-based light-shielding film 12 on the multilayer phase shift film 2; a phase shift mask blank comprising a chromium-based light-shielding film 12 on the multilayer phase shift film 2 and a chromium-based antireflective film 13 formed on the chromium-based light-shielding film 12 for reducing reflection from the light-shielding film 12; and a phase shift mask blank comprising a multilayer phase shift film 2, a first chromium-based antireflective film 13', a chromium-based light-shielding film 12, and a second chromium-based antireflective film 13 formed on a transparent substrate 1 in the described order, as best shown in FIG. 8.

The chromium-based light-shielding film 12 or chromium-based antireflective film 13 is preferably made of chromium oxycarbide (CrOC), chromium oxynitride carbide (CrONC) or a multilayer combination of both.

The chromium-based light-shielding film or chromium-based antireflective film can be formed by reactive sputtering. Specifically, the target is neat chromium or chromium having added thereto oxygen, nitrogen, carbon or a combination thereof. The sputtering gas is an inert gas such as neon, argon or krypton to which carbon dioxide gas is added as a carbon source.

For example, sputtering gases which may be used to form a CrONC film include a gas mixture composed of at least one each of a carbon-containing gas (e.g., $CH_4$, $CO_2$, CO), a nitrogen-containing gas (e.g., NO, $NO_2$, $N_2$) and an oxygen-containing gas (e.g., $CO_2$, NO, $O_2$), or any such gas mixture in combination with an inert gas such as argon, neon or krypton. Using $CO_2$ gas or CO gas as both the carbon and oxygen sources is especially advantageous for uniformity in the plane of the substrate and for controllability during production. Each of the sputtering gases may be separately fed into the sputtering chamber, or some or all of the gases may first be mixed together then fed into the chamber.

Preferably the CrOC film consists essentially of 20 to 95 atom %, especially 30 to 85 atom % of Cr, 1 to 30 atom %, especially 5 to 20 atom % of C, and 1 to 60 atom %, especially 5 to 50 atom % of O; and the CrONC film consists essentially of 20 to 95 atom %, especially 30 to 80 atom % of Cr, 1 to 20 atom %, especially 2 to 15 atom % of C, 1 to 60 atom %, especially 5 to 50 atom % of O, and 1 to 30 atom %, especially 3 to 20 atom % of N.

The light-shielding film and the antireflective film each may have a thickness which is commonly employed in conventional phase shift mask blanks. Typically the light-shielding film has a thickness of 20 to 100 nm, preferably 30 to 60 nm and the antireflective film has a thickness of 5 to 40 nm, preferably 10 to 30 nm.

Figure 9:
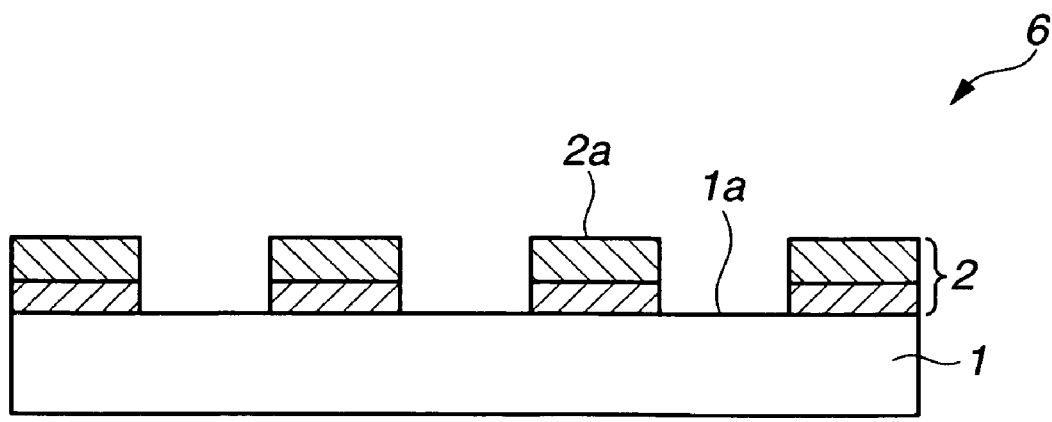
FIG. 9 is a cross-sectional view of an exemplary halftone phase shift mask in the first embodiment of the invention.
Figure 10A:
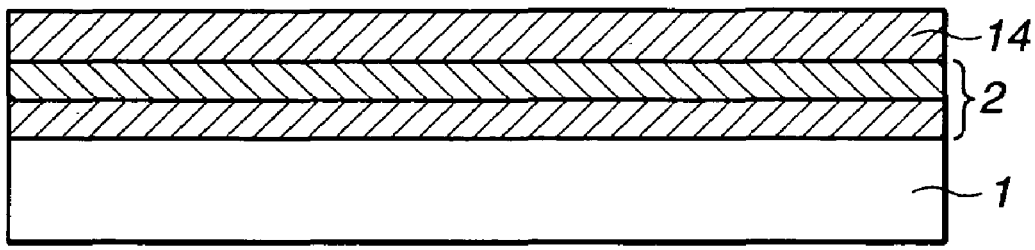
FIG. 10 illustrates in sectional view the method of manufacturing a halftone phase shift mask in the first embodiment of the invention.
Figure 10B:
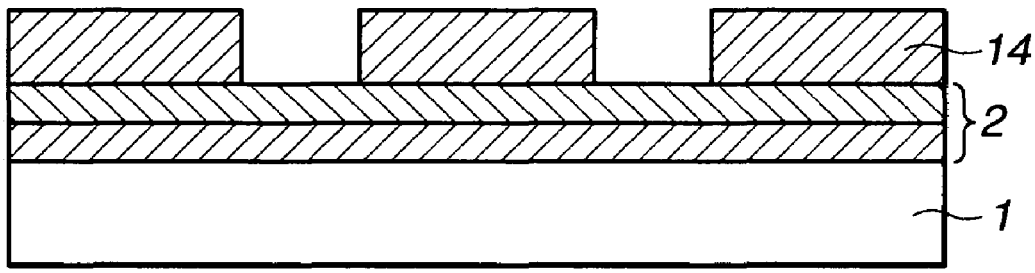
Figure 10C:
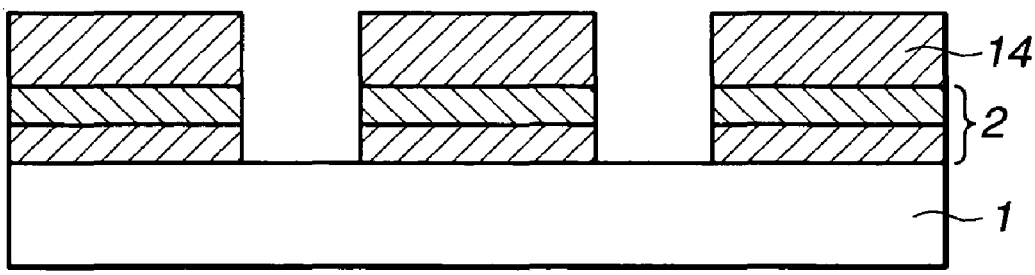
Figure 10D:
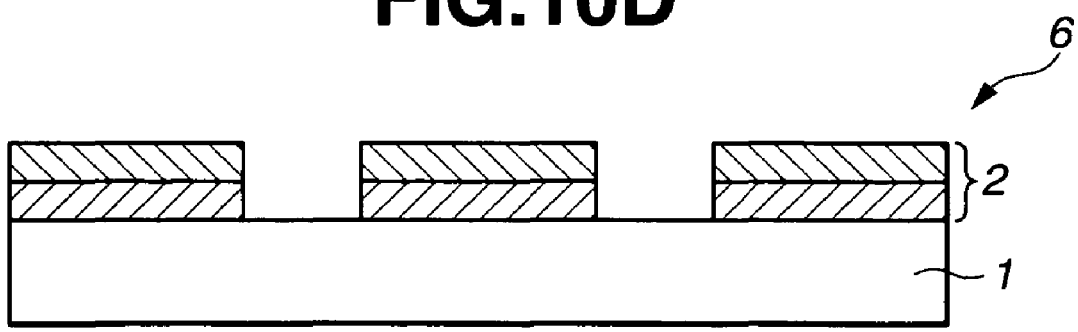

The phase shift mask is manufactured by patterning the multilayer phase shift film on the phase shift mask blank of the first embodiment as produced above. More specifically, by patterning the multilayer phase shift film 2 on the phase shift mask blank shown in FIG. 5, a phase shift mask as shown in FIG. 9 is manufactured. The phase shift mask includes phase shifter sections 2a forming the pattern on the substrate 1 and uncovered areas 1a of the substrate therebetween.

The phase shift mask 6 of the structure shown in FIG. 9 may be manufactured by a process as shown in FIG. 10. After a multilayer phase shift film 2 is formed on a substrate 1 by the process described above, a resist film 14 is formed on the film 2 (FIG. 10A). The resist film 14 is lithographically patterned (FIG. 10B), after which the phase shift film 2 is etched (FIG. 10C), and the resist film 14 is subsequently stripped (FIG. 10D). In this process, application of the resist film, patterning (exposure and development), etching, and removal of the resist film may be carried out by known methods. The multilayer phase shift film in the first embodiment can be etched in two ways, using a single set of etching conditions or two different sets of etching conditions depending on a particular light absorbing film selected.

Figure 11:
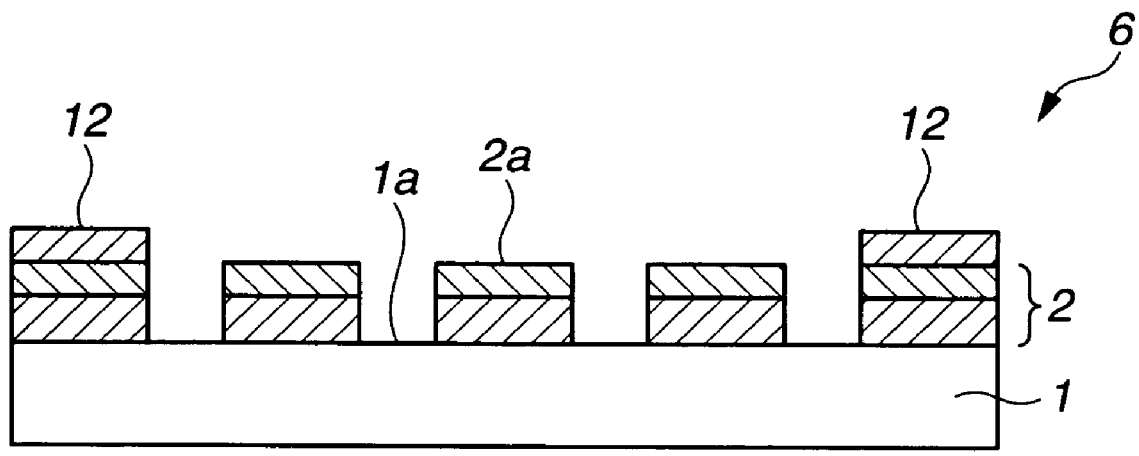
FIG. 11 is a cross-sectional view of another exemplary halftone phase shift mask in the first embodiment of the invention.

In cases where a Cr-based film (e.g., chromium-based light-shielding film and/or chromium-based antireflective film) is formed on the multilayer phase shift film, a phase shift mask 6 on which the Cr-based film (chromium-based light-shielding film 12) remains at the peripheral edges of the upper surface of the substrate 1 (see FIG. 11) can be produced by etching away the Cr-based film 12 in the regions that are to be subject to light exposure, thereby leaving the surface of the phase shift film 2 exposed, then patterning the phase shift film 2 into sections 2a as described above. Alternatively, a phase shift mask can be produced by applying a resist to the Cr-based film 12 and patterning the resist, then etching the Cr-based film 12 and the phase shift film 2 for patterning. Only the regions of the Cr-based film 12 that are to be subject to light exposure are then removed by selective etching so as to leave the phase shift pattern exposed at the surface.

The multilayer phase shift film formed on the phase shift mask blank and phase shift mask of the first embodiment is characterized by the minimal dependence of transmittance on wavelength and an ability to be processed with a single dry etching gas and offers satisfactory transmittances to both the wavelengths of light exposure and inspection. Therefore, the phase shift mask blank and phase shift mask of the first embodiment are best suited as, but not limited to, a high transmittance, halftone phase shift mask blank and phase shift mask adapted for exposure to ArF excimer laser and a halftone phase shift mask blank and phase shift mask adapted for exposure to $F_2$ laser, which require the minimal dependence of transmittance on wavelength.

In the manufacture of the phase shift mask of the first embodiment, high-precision processing to the design is possible. The use of the mask in photolithography allows the focal depth to be expanded as expected in forming a pattern on the resist.

Second and Third Embodiments

Described below are the halftone phase shift mask blanks, halftone phase shift masks and pattern transfer methods in the second and third embodiments of the present invention that attain the second object.

Second Embodiment

The halftone phase shift mask blank of the second embodiment comprises a substrate which is transparent to exposure light and a halftone phase shift film formed thereon having a preselected phase difference and transmittance. The halftone phase shift film is composed of a single layer or multiple layers. At least one layer of the halftone phase shift film comprises silicon and a plurality of metal elements as constituent elements. The content of silicon is at least 90 atom % based on the total of silicon and metal elements.

More particularly, the halftone phase shift mask blank of the second embodiment comprises a substrate of quartz (synthetic quartz) which is transparent to exposure light, especially exposure light of short wavelength such as $F_2$ laser (157 nm). A halftone phase shift film composed of a single layer or multiple layers is formed on the substrate.

Figure 13:
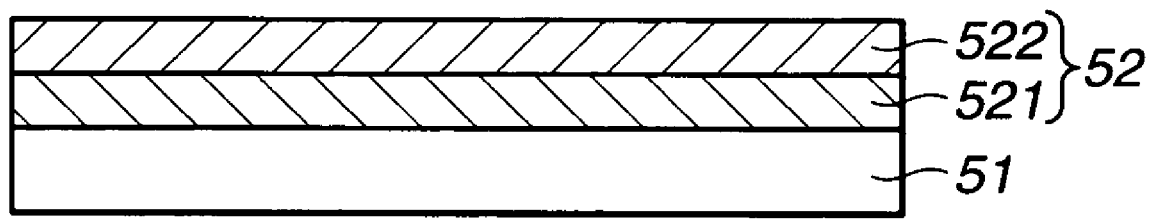
FIG. 13 is a cross-sectional view of an exemplary halftone phase shift mask blank in the second embodiment of the invention.

In the second embodiment, the halftone phase shift film may be composed of a single layer or multiple layers, preferably multiple layers, especially two layers. As a typical example of the halftone phase shift mask blank of the second embodiment, a halftone phase shift mask blank comprising a halftone phase shift film composed of two layers is illustrated in FIG. 13. On a transparent substrate 51, a first layer 521 and a second layer 522 are laid in order to form a halftone phase shift film 52.

Where the halftone phase shift film is composed of multiple layers in the second embodiment, it is preferred that each layer have both a function of adjusting phase difference and a function of adjusting transmittance. The phase difference and transmittance of respective layers are adjusted such that the overall halftone phase shift film (all the layers of halftone phase shift film) may have desired values of phase difference and transmittance.

Herein, the halftone phase shift film may have a multilayer structure including in alternate formation at least one light-shielding layer for mainly adjusting transmittance, preferably one light-shielding layer and at least one transparent layer for mainly adjusting phase difference, preferably one transparent layer, with the outermost surface layer being a transparent layer. The light-shielding layer and the transparent layer are different in transmittance. Typically, the transparent layer has a higher transmittance than the light-shielding layer.

In the halftone phase shift film of the second embodiment, at least one layer of the phase shift film comprises silicon and a plurality of metal elements as constituent elements. It is noted that when the halftone phase shift film consists of a single layer, the at least one layer refers to that single layer, and when the halftone phase shift film consists of multiple layers, the at least one layer refers to at least one of the multiple layers.

In the layer comprising silicon and a plurality of metal elements, the content of silicon is at least 90 atom %, preferably at least 95 atom %, based on the total of silicon and metal elements. The upper limit of silicon content is preferably up to 99 atom %.

With a silicon content of less than 90 atom %, the halftone phase shift film may have a lower etching rate, especially a lower rate of etching with fluorine-based gas and become less processable. Inversely, with a silicon content of more than 99 atom %, which corresponds to a minimal content of metal component, the layer comprising silicon and metal elements and hence, the entire halftone phase shift film including that layer may have a lower electroconductivity or an increased sheet resistance, which can invite dielectric breakdown or cause a charge build-up to SEM for line width measurement.

In the second embodiment, the layer of which the halftone phase shift film is constructed preferably has a sheet resistance of up to $1 \times 10^{12}$ ohm/square.

Where the halftone phase shift film consists of multiple layers, it is preferred from the standpoint of etching rate that the layers are laid such that the rate of etching with fluorine-based gas of the respective layers may increase from the substrate side toward the remote side and the rate of etching with chlorine-based gas of the respective layers may decrease from the substrate side toward the remote side.

Also it is preferred from the standpoint of electric conduction that the layers are laid such that the conductivity of the respective layers may decrease from the substrate side toward the remote side.

In the layer comprising silicon and a plurality of metal elements, examples of the plurality of metal elements include molybdenum, zirconium and hafnium, but are not limited thereto. In the preferred layer comprising silicon and a plurality of metal elements, the plurality of metal elements include a first metal component (M1) and a second metal component (M2), and the first metal component is molybdenum and the second metal component consists of zirconium or hafnium or both. Illustratively, the preferred layer comprising silicon and a plurality of metal elements encompasses a layer containing two elements: Mo and Zr; a layer containing two elements: Mo and Hf; and a layer containing three elements: Mo, Zr and Hf as the metal elements.

In the layer comprising silicon and a plurality of metal elements wherein the content of silicon is at least 90 atom % based on the total of silicon and metal elements, the atomic ratio of first metal component to second metal component [M1/M2] is preferably up to 5. If the atomic ratio of first metal component to second metal component is more than 5, the layer may become less resistant to chemical liquid, especially alkaline cleaning liquid such as ammonium hydroxide/hydrogen peroxide/deionized water mix (APM).

In the layer comprising silicon and a plurality of metal elements, where the content of silicon is at least 90 atom % based on the total of silicon and metal elements, and where the plurality of metal elements include first and second metal components, the preferred contents of silicon and first and second metal components are such that the content of silicon is 90 to 99 atom %, the content of first metal component is up to 8.3 atom %, and the content of second metal component is at least 0.15 atom %, based on the total of silicon and first and second metal components [Si+M1+M2]. The total of silicon and first and second metal components is 100 atom %.

Further in the layer comprising silicon and a plurality of metal elements, where the content of silicon is at least 95 atom % based on the total of silicon and metal elements, and where the plurality of metal elements include first and second metal components, the atomic ratio of the first metal component to the second metal component [M1/M2] is preferably up to 6. If the atomic ratio of first metal component to second metal component is more than 6, the layer may become less resistant to chemical liquid, especially alkaline cleaning liquid such as APM.

Where the content of silicon is at least 95 atom % based on the total of silicon and metal elements, the preferred contents of silicon and first and second metal components are such that the content of silicon is 95 to 99 atom %, the content of first metal component is up to 4.3 atom %, and the content of second metal component is at least 0.15 atom %, based on the total of silicon and first and second metal components [Si+M1+M2]. The total of silicon and first and second metal components is 100 atom %.

Preferably the layer comprising silicon and a plurality of metal elements may further comprise at least one light element selected from the group consisting of hydrogen, oxygen, nitrogen, carbon and halogen, as a constituent element, and more preferably oxygen or nitrogen or both. Illustrative are compounds containing silicon and a plurality of metal elements, for example, oxides such as MoZrSiO (if the metal elements are Mo and Zr) or MoHfSiO (if the metal elements are Mo and Hf); nitrides such as MoZrSiN (if the metal elements are Mo and Zr) or MoHfSiN (if the metal elements are Mo and Hf); and oxynitrides such as MoZrSiON (if the metal elements are Mo and Zr) or MoHfSiON (if the metal elements are Mo and Hf).

In the second embodiment, where the halftone phase shift film is composed of multiple layers, and where each layer comprises silicon and first and second metal components (M1 and M2), the layers are preferably laid up such that the atomic ratio of the sum of first and second metal components to silicon, [(M1+M2)/Si], decreases from the substrate side toward the remote side. Where each layer further comprises a light element component (L) of oxygen or nitrogen or both, the layers are preferably laid up such that the atomic ratio of the light element component to the sum of silicon, first and second metal components, and light element component, [L/(Si+M1+M2+L)], increases from the substrate side toward the remote side.

In general, the system for inspecting defects in the halftone phase shift film uses light having a longer wavelength than that of exposure light used in the lithography. The film often has a higher transmittance at the inspection wavelength. Particularly when the exposure light has a shorter wavelength as in the case of $F_2$ laser (157 nm), the halftone phase shift film adapted thereto has so high a transmittance at the inspection wavelength, for example, a wavelength of about 257 nm, as to inhibit inspection. When the halftone phase shift film is composed of multiple layers which are constructed as mentioned above, the light reflected by a layer on the remote side interferes with the light reflected by a layer on the substrate side to reduce the transmittance at the inspection wavelength used in the inspection of the halftone phase shift film, for example, a wavelength of about 257 nm. Then a distinct contrast relative to the quartz is so readily established that the inspection of the halftone phase shift film is facilitated. The wavelength at which the halftone phase shift film exhibits a lower transmittance can be selected by properly adjusting the composition and thickness of the halftone phase shift film.

Also since the thickness of the halftone phase shift film necessary to provide a preselected phase difference and transmittance is reduced, the dimensional accuracy of dry etching is improved. This is because the phase difference is also affected by interference. The second embodiment is effective for reducing the influence of interference and thus allows the halftone phase shift film to be designed to a reduced thickness. In addition, a layer having a higher conductivity may be laid on the substrate side, minimizing the risks of dielectric breakdown and a charge build-up in SEM for line width measurement. There are advantages including a good contrast upon line width measurement by SEM and ease of pattern repair.

Where the halftone phase shift film is composed of multiple layers, it is preferred from the standpoint of inspection compatibility that the layers be laid up such that the extinction coefficient of respective layers decreases from the substrate side toward the remote side.

The thickness of layers of the halftone phase shift film is not particularly limited. Particularly when the halftone phase shift film is composed of multiple layers, light-shielding layers and transparent layers, the light-shielding layer preferably has a thickness of 1 to 30 nm, more preferably 5 to 20 nm, and the transparent layer preferably has a thickness of 50 to 120 nm, more preferably 40 to 70 nm. The entire halftone phase shift film has a thickness of about 70 to 150 nm, especially about 70 to 90 nm.

The halftone phase shift film of such a halftone phase shift mask blank may be deposited by selecting any of metal targets, silicon targets and metal and silicon-containing targets in accordance with, when the film is composed of a single layer, the composition of that single layer and when the film is composed of multiple layers, the composition of each layer, feeding an inert gas such as helium, neon or argon gas into the chamber, and sputtering the target.

In an example wherein the plurality of metal elements are molybdenum and zirconium, a choice is made among a neat molybdenum target, a neat zirconium target, a neat silicon target, a sintered target of molybdenum and zirconium, a sintered target of molybdenum and silicon, a sintered target of zirconium and silicon, and a sintered target of molybdenum, zirconium and silicon. The targets are combined so that the layer deposited therefrom may contain Si, Mo and Zr in a desired proportion.

In another example wherein the plurality of metal elements are molybdenum and hafnium, a choice is made among a neat molybdenum target, a neat hafnium target, a neat silicon target, a sintered target of molybdenum and hafnium, a sintered target of molybdenum and silicon, a sintered target of hafnium and silicon, and a sintered target of molybdenum, hafnium and silicon. The targets are combined so that the layer deposited therefrom may contain Si, Mo and Hf in a desired proportion.

In a further example wherein the plurality of metal elements are Mo, Zr and Hf, a choice is made among the targets listed above for the example wherein the metals are Mo and Zr and the other example wherein the metals are Mo and Hf. The targets are combined so that the layer deposited therefrom may contain Si, Mo, Zr and Hf in a desired proportion.

The sputtering may be performed by selecting one or more from the foregoing targets. When more than one target is used, the process is a multiple simultaneous sputtering, known as co-sputtering.

Where the layer of the halftone phase shift film is formed of a compound comprising silicon and a plurality of metal elements such as an oxide, nitride or oxynitride, it may be deposited by reactive sputtering using a mixture of an inert gas and a reactive gas such as oxygen-containing gas or nitrogen-containing gas, typically nitrogen, oxygen or nitrogen oxide gas.

In an example where MoZrSiON is to be deposited, reactive sputtering is performed by using a target consisting of molybdenum, zirconium and silicon, or a target consisting of molybdenum and silicon and a target consisting of zirconium and silicon, and optionally a neat silicon target and mixing argon gas as an inert gas with nitrogen gas and oxygen gas as reactive gases.

The sputtering technique is not particularly limited although DC sputtering is typically employed.

The composition of the halftone phase shift film, that is, when the halftone phase shift film consists of a single layer, the composition of that single layer, and when the halftone phase shift film consists of multiple layers, the composition of each layer, contains components originating from the target or targets, that is, silicon and a plurality of metal elements. The contents of respective components can be tailored by altering the composition of the target containing plural elements, or by controlling the electric powers applied to a plurality of targets if used. The power applied to each target is preferably about 100 to 1,000 watts, more preferably about 200 to 900 watts, thought not limited thereto.

The content of a component originating from the reactive gas, typically a light element component such as oxygen or nitrogen can be tailored by properly controlling the amount of the reactive gas (e.g., oxygen- or nitrogen-containing gas) fed to the sputtering chamber and optionally the amount of the inert gas fed.

In general, as the halftone phase shift film on the surface is oxidized in air, it changes its composition and thickness with the passage of time and accordingly changes its phase difference and transmittance. If the halftone phase shift film is previously oxidized to such an extent that no further oxidation proceeds in a normal environment, the influence of oxidation in air on phase difference and transmittance is avoided. Specifically, the halftone phase shift film is heated in an oxygen-containing atmosphere, typically air, thereby forming a thermally oxidized thin film on the surface (the surface of outermost layer). Equivalent results are obtained when any of oven heating, lamp annealing and laser heating is used as the heating means.

Figure 14:
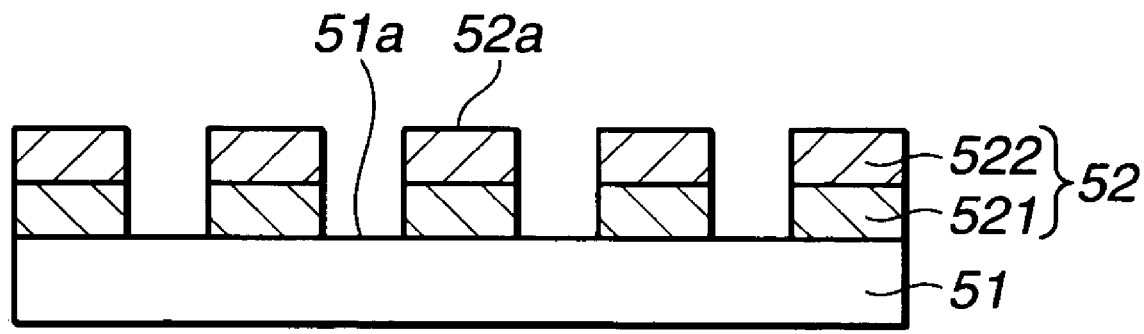
FIG. 14 is a cross-sectional view of an exemplary halftone phase shift mask in the second embodiment of the invention.
Figure 15A:
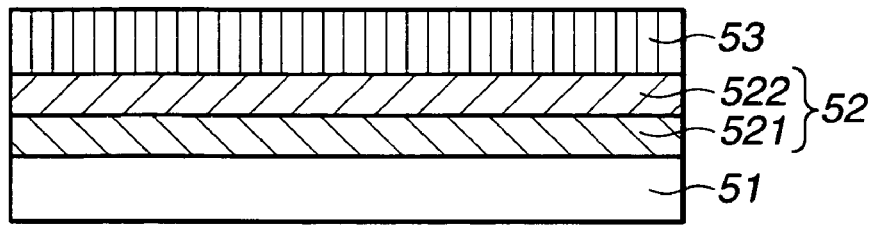
FIG. 15A shows the mask blank on which a resist film has been formed.
Figure 15B:
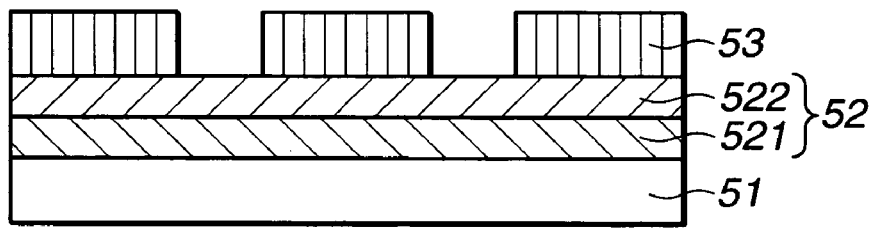
FIG. 15B shows the structure after the resist film has been patterned.
Figure 15C:
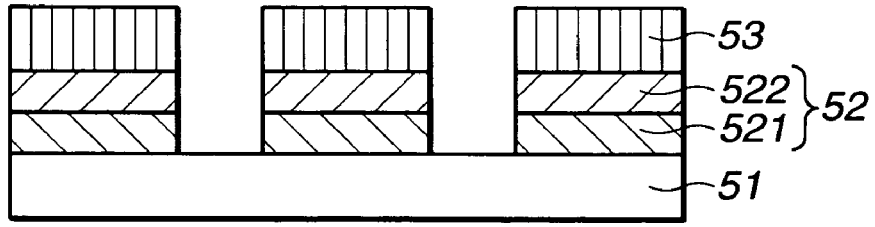
FIG. 15C shows the structure after dry etching.
Figure 15D:
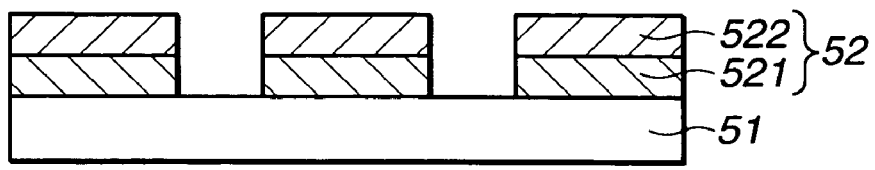
FIG. 15D shows the structure after the resist film has been removed.

The phase shift mask is manufactured by patterning the halftone phase shift film on the halftone phase shift mask blank of the second embodiment as produced above. More specifically, by patterning the halftone phase shift film 52 (consisting of first and second layers 521 and 522 lying on the substrate in order) on the phase shift mask blank shown in FIG. 13, a phase shift mask as shown in FIG. 14 is manufactured. The phase shift mask includes patterned translucent regions 52a and transparent regions 51a therebetween.

The phase shift mask of the structure shown in FIG. 14 may be manufactured by a process as shown in FIG. 15. After a halftone phase shift film 52 (consisting of orderly lying first and second layers 521 and 522) is formed on a transparent substrate 51 by the process described above, a resist film 53 is coated on the film 52 (FIG. 15A). The resist film 53 is patterned by lithography including electron beam exposure and development (FIG. 15B), after which the phase shift film 52 is dry etched (FIG. 15C), and the resist film 53 is subsequently stripped (FIG. 15D). In this process, application of the resist film, patterning (exposure and development), etching, and removal of the resist film may be carried out by known methods.

For dry etching of the halftone phase shift film formed on the halftone phase shift mask blank of the second embodiment, use may be made of etching with a fluorine-based gas such as fluorocarbon, e.g., $C_2F_6$, $CF_4$, $C_3F_8$ or $SF_6$ or etching with a chlorine-based gas such as $Cl_2$. Etching with a fluorine-based gas is advantageous because of a higher etching rate.

Third Embodiment

The halftone phase shift mask blank of the third embodiment comprises a substrate which is transparent to exposure light and a halftone phase shift film formed thereon having a preselected phase difference and transmittance. The halftone phase shift film has a multilayer structure including in alternate formation at least one light-shielding layer for mainly adjusting transmittance and at least one transparent layer for mainly adjusting phase difference, with the outermost surface layer being a transparent layer. The light-shielding layer, preferably both the light-shielding layer and the transparent layer, comprise silicon, a first metal component of molybdenum, and a second metal component of zirconium or hafnium or both, as constituent elements.

More particularly, the halftone phase shift mask blank of the third embodiment comprises a substrate of quartz (synthetic quartz) which is transparent to exposure light, especially exposure light of short wavelength such as $F_2$ laser (157 nm). A halftone phase shift film having a multilayer structure including at least one light-shielding layer for mainly adjusting transmittance and at least one transparent layer for mainly adjusting phase difference is formed on the substrate. The layers are alternately arranged such that the outermost surface layer is a transparent layer.

Figure 16:
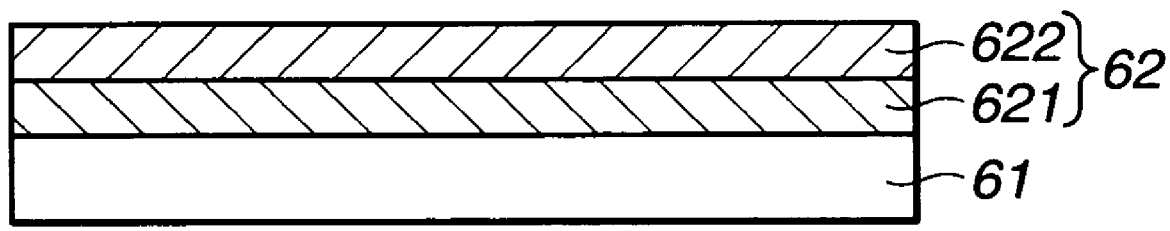
FIG. 16 is a cross-sectional view of an exemplary halftone phase shift mask blank in the third embodiment of the invention.

As a typical example of the halftone phase shift mask blank of the third embodiment, a halftone phase shift mask blank comprising a halftone phase shift film composed of two layers, one light-shielding layer and one transparent layer is illustrated in FIG. 16. On a transparent substrate 61, a light-shielding layer 621 and a transparent layer 622 are laid in order to form a halftone phase shift film 62.

Where the halftone phase shift film is composed of light-shielding and transparent layers in the third embodiment, it is preferred that each layer have both a function of adjusting phase difference and a function of adjusting transmittance. The phase difference and transmittance of respective layers are adjusted such that the overall halftone phase shift film (all the layers of halftone phase shift film) may have desired values of phase difference and transmittance. The light-shielding layer and the transparent layer are different in transmittance. Typically, the transparent layer has a higher transmittance than the light-shielding layer.

In the third embodiment, the light-shielding layer, preferably both the light-shielding layer and the transparent layer, comprise silicon, a first metal component of molybdenum, and a second metal component of zirconium or hafnium or both, as constituent elements. In the layer comprising silicon and first and second metal components, the content of silicon is at least 90 atom %, preferably at least 95 atom %, based on the total of silicon and first and second metal components. The upper limit of silicon content is preferably up to 99 atom %.

With a silicon content of less than 90 atom %, the halftone phase shift film may have a lower etching rate, especially a lower rate of etching with fluorine-based gas and become less processable. Inversely, with a silicon content of more than 99 atom %, which corresponds to a minimal content of metal component, the layer comprising silicon and first and second metal components and hence, the entire halftone phase shift film including that layer may have a lower electroconductivity or an increased sheet resistance, which can invite dielectric breakdown or cause a charge build-up to SEM for line width measurement.

In the third embodiment, the layer of which the halftone phase shift film is constructed preferably has a sheet resistance of up to $1\times10^{12}$ ohm/square.

It is preferred from the standpoint of etching rate that the layers of the halftone phase shift film are laid up such that the rate of etching with fluorine-based gas of the respective layers may increase from the substrate side toward the remote side and the rate of etching with chlorine-based gas of the respective layers may decrease from the substrate side toward the remote side.

Also it is preferred from the standpoint of electric conduction that the layers of the halftone phase shift film are laid up such that the conductivity of the respective layers may decrease from the substrate side toward the remote side.

In the third embodiment, the light-shielding layer and preferably both the light-shielding layer and the transparent layer comprises silicon, a first metal component of molybdenum, and a second metal component of zirconium or hafnium or both. Illustratively, the preferred layer comprising silicon and first and second metal components encompasses a layer containing two elements: Mo and Zr; a layer containing two elements: Mo and Hf; and a layer containing three elements: Mo, Zr and Hf as the metal elements.

In the layer comprising silicon and first and second metal components wherein the content of silicon is at least 90 atom % based on the total of silicon and first and second metal components (M1 and M2), the atomic ratio of first metal component to second metal component [M1/M2] is preferably up to 5. If the atomic ratio of first metal component to second metal component is more than 5, the layer may become less resistant to chemical liquid, especially alkaline cleaning liquid such as APM.

In the layer comprising silicon and first and second metal components (M1 and M2), where the content of silicon is at least 90 atom % based on the total of silicon and first and second metal components [Si+M1+M2], the preferred contents of silicon and first and second metal components are such that the content of silicon is 90 to 99 atom %, the content of first metal component is up to 8.3 atom %, and the content of second metal component is at least 0.15 atom %, based on the total of silicon and first and second metal components [Si+M1+M2]. The total of silicon and first and second metal components is 100 atom %.

Further in the layer comprising silicon and first and second metal components (M1 and M2), where the content of silicon is at least 95 atom % based on the total of silicon and first and second metal components [Si+M1+M2], the atomic ratio of the first metal component to the second metal component [M1/M2] is preferably up to 6. If the atomic ratio of first metal component to second metal component is more than 6, the layer may become less resistant to chemical liquid, especially alkaline cleaning liquid such as APM.

Where the content of silicon is at least 95 atom % based on the total of silicon and first and second metal components [Si+M1+M2], the preferred contents of silicon and first and second metal components are such that the content of silicon is 95 to 99 atom %, the content of first metal component is up to 4.3 atom %, and the content of second metal component is at least 0.15 atom %, based on the total of silicon and first and second metal components [Si+M1+M2]. The total of silicon and first and second metal components is 100 atom %.

Preferably the layer comprising silicon and first and second metal components may further comprise at least one light element selected from the group consisting of hydrogen, oxygen, nitrogen, carbon and halogen, as a constituent element, and more preferably oxygen or nitrogen or both. Illustrative are compounds containing silicon and first and second metal components, for example, oxides such as MoZrSiO (if the first and second metals are Mo and Zr) or MoHfSiO (if the first and second metals are Mo and Hf); nitrides such as MoZrSiN (if the first and second metals are Mo and Zr) or MoHfSiN (if the first and second metals are Mo and Hf); and oxynitrides such as MoZrSiON (if the first and second metals are Mo and Zr) or MoHfSiON (if the first and second metals are Mo and Hf).

In the third embodiment, where the halftone phase shift film is composed of multiple layers, and where each layer comprises silicon and first and second metal components (M1 and M2), the layers are preferably laid up such that the atomic ratio of the sum of first and second metal components to silicon, [(M1+M2)/Si], decreases from the substrate side toward the remote side. Where each layer further comprises a light element component (L) of oxygen or nitrogen or both, the layers are preferably laid up such that the atomic ratio of the light element component to the sum of silicon, first and second metal components, and light element component, [L/(Si+M1+M2+L)], increases from the substrate side toward the remote side.

In general, the system for inspecting defects in the halftone phase shift film uses light having a longer wavelength than that of exposure light used in the lithography. The film often has a higher transmittance at the inspection wavelength. Particularly when the exposure light has a shorter wavelength as in the case of $F_2$ laser (157 nm), the halftone phase shift film adapted thereto has so high a transmittance at the inspection wavelength, for example, a wavelength of about 257 nm, as to inhibit inspection. When the halftone phase shift film is composed of multiple layers which are constructed as mentioned above, the light reflected by a layer on the remote side interferes with the light reflected by a layer on the substrate side to reduce the transmittance at the inspection wavelength used in the inspection of the halftone phase shift film, for example, a wavelength of about 257 nm. Then a distinct contrast relative to the quartz is so readily established that the inspection of the halftone phase shift film is facilitated. The wavelength at which the halftone phase shift film exhibits a lower transmittance can be selected by properly adjusting the composition and thickness of the halftone phase shift film.

Also since the thickness of the halftone phase shift film necessary to provide a preselected phase difference and transmittance is reduced, the dimensional accuracy of dry etching is improved. This is because the phase difference is also affected by interference. The third embodiment is effective for reducing the influence of interference and thus allows the halftone phase shift film to be designed to a reduced thickness. In addition, a layer having a higher conductivity may be laid on the substrate side, minimizing the risks of dielectric breakdown and a charge build-up in SEM for line width measurement. There are advantages including a good contrast upon line width measurement by SEM and ease of pattern repair.

Moreover, it is preferred from the standpoint of inspection compatibility that the layers of the halftone phase shift film be laid up such that the extinction coefficient of respective layers decreases from the substrate side toward the remote side.

The thickness of layers of the halftone phase shift film is not particularly limited. The light-shielding layer preferably has a thickness of 1 to 30 nm, more preferably 5 to 20 nm, and the transparent layer preferably has a thickness of 50 to 120 nm, more preferably 40 to 70 nm. The entire halftone phase shift film has a thickness of about 70 to 150 nm, especially about 70 to 90 nm.

The halftone phase shift film of such a halftone phase shift mask blank may be deposited by selecting any of metal targets, silicon targets and metal and silicon-containing targets in accordance with the composition of the light-shielding or transparent layer, feeding an inert gas such as helium, neon or argon gas into the chamber, and sputtering the target.

In an example wherein the first and second metals are molybdenum and zirconium, a choice is made among a neat molybdenum target, a neat zirconium target, a neat silicon target, a sintered target of molybdenum and zirconium, a sintered target of molybdenum and silicon, a sintered target of zirconium and silicon, and a sintered target of molybdenum, zirconium and silicon. The targets are combined so that the layer deposited therefrom may contain Si, Mo and Zr in a desired proportion.

In another example wherein the first and second metals are molybdenum and hafnium, a choice is made among a neat molybdenum target, a neat hafnium target, a neat silicon target, a sintered target of molybdenum and hafnium, a sintered target of molybdenum and silicon, a sintered target of hafnium and silicon, and a sintered target of molybdenum, hafnium and silicon. The targets are combined so that the layer deposited therefrom may contain Si, Mo and Hf in a desired proportion.

In a further example wherein the first and second metals are Mo, Zr and Hf, a choice is made among the targets listed above for the example wherein the first and second metals are Mo and Zr and the other example wherein the first and second metals are Mo and Hf. The targets are combined so that the layer deposited therefrom may contain Si, Mo, Zr and Hf in a desired proportion.

The sputtering may be performed by selecting one or more from the foregoing targets. When more than one target is used, the process is a multiple simultaneous sputtering, known as co-sputtering.

Where the layer of the halftone phase shift film is formed of a compound comprising silicon and first and second metal components such as an oxide, nitride or oxynitride, it may be deposited by reactive sputtering using a mixture of an inert gas and a reactive gas such as oxygen-containing gas or nitrogen-containing gas, typically nitrogen, oxygen or nitrogen oxide gas.

In an example where MoZrSiON is to be deposited, reactive sputtering is performed by using a target consisting of molybdenum, zirconium and silicon, or a target consisting of molybdenum and silicon and a target consisting of zirconium and silicon, and optionally a neat silicon target and mixing argon gas as an inert gas with nitrogen gas and oxygen gas as reactive gases.

The sputtering technique is not particularly limited although DC sputtering is typically employed.

The composition of the halftone phase shift film, that is, the composition of the light-shielding or transparent layer, contains components originating from the target or targets, that is, silicon and first and second metal components. The contents of respective components can be tailored by altering the composition of the target containing plural elements, or by controlling the electric powers applied to a plurality of targets if used. The power applied to each target is preferably about 100 to 1,000 watts, more preferably about 200 to 900 watts, thought not limited thereto.

The content of a component originating from the reactive gas, typically a light element component such as oxygen or nitrogen can be tailored by properly controlling the amount of the reactive gas (e.g., oxygen- or nitrogen-containing gas) fed to the sputtering chamber and optionally the amount of the inert gas fed.

In general, as the halftone phase shift film on the surface is oxidized in air, it changes its composition and thickness with the passage of time and accordingly changes its phase difference and transmittance. If the halftone phase shift film is previously oxidized to such an extent that no further oxidation proceeds in a normal environment, the influence of oxidation in air on phase difference and transmittance is avoided. Specifically, the halftone phase shift film is heated in an oxygen-containing atmosphere, typically air, thereby forming a thermally oxidized thin film on the surface (the surface of outermost layer). Equivalent results are obtained when any of oven heating, lamp annealing and laser heating is used as the heating means.

Figure 17:
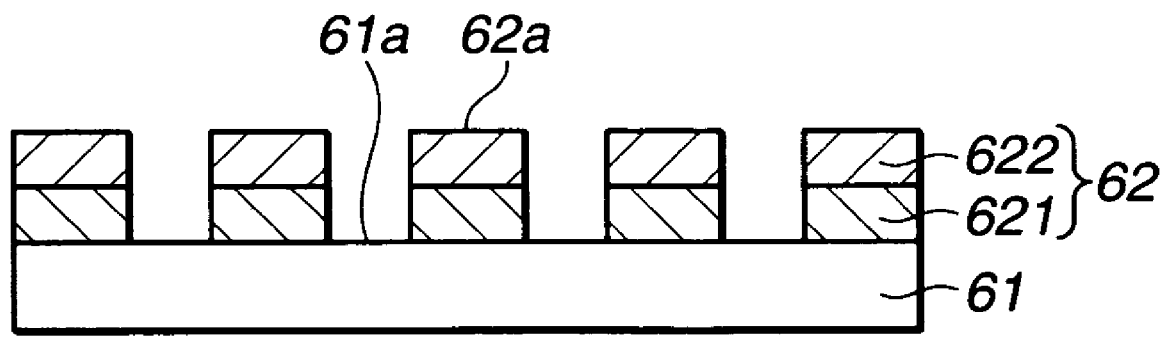
FIG. 17 is a cross-sectional view of an exemplary halftone phase shift mask in the third embodiment of the invention.
Figure 18A:
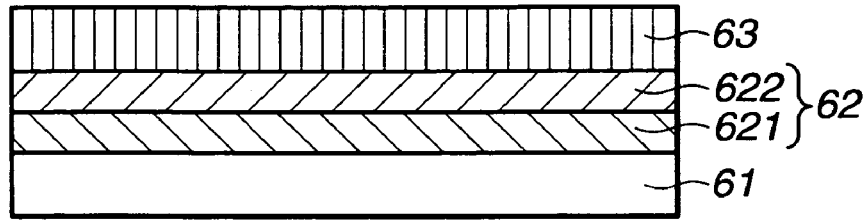
FIG. 18A shows the mask blank on which a resist film has been formed.
Figure 18B:
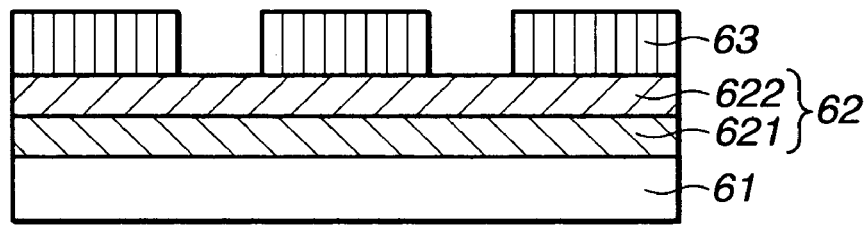
FIG. 18B shows the structure after the resist film has been patterned.
Figure 18C:
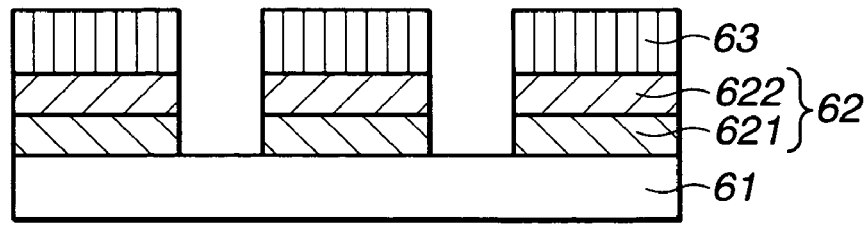
FIG. 18C shows the structure after dry etching.
Figure 18D:
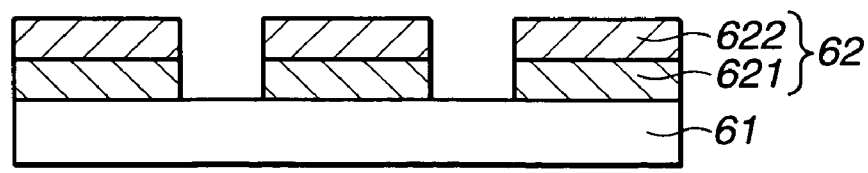
FIG. 18D shows the structure after the resist film has been removed.

The phase shift mask is manufactured by patterning the halftone phase shift film on the halftone phase shift mask blank of the third embodiment as produced above. More specifically, by patterning the halftone phase shift film 62 (consisting of light-shielding layer 621 and transparent layer 622 lying on the substrate in order) on the phase shift mask blank shown in FIG. 16, a phase shift mask as shown in FIG. 17 is manufactured. The phase shift mask includes patterned translucent regions 62a and transparent regions 61a therebetween.

The phase shift mask of the structure shown in FIG. 17 may be manufactured by a process as shown in FIG. 18. After a halftone phase shift film 62 (consisting of orderly lying light-shielding layer 621 and transparent layer 622) is formed on a transparent substrate 61 by the process described above, a resist film 63 is coated on the film 62 (FIG. 18A). The resist film 63 is patterned by lithography including electron beam exposure and development (FIG. 18B), after which the phase shift film 62 is dry etched (FIG. 18C), and the resist film 63 is subsequently stripped (FIG. 18D). In this process, application of the resist film, patterning (exposure and development), etching, and removal of the resist film may be carried out by known methods.

For dry etching of the halftone phase shift film formed on the halftone phase shift mask blank of the third embodiment, use may be made of etching with a fluorine-based gas such as fluorocarbon, e.g., $C_2F_6$, $CF_4$, $C_3F_8$ or $SF_6$ or etching with a chlorine-based gas such as $Cl_2$. Etching with a fluorine-based gas is advantageous because of a higher etching rate.

The halftone phase shift masks of the second and third embodiments are advantageously used in the imagewise exposure of photoresists involved in the fabrication of semiconductor integrated circuits. The exposure wavelength with which the halftone phase shift mask blanks and halftone phase shift masks of the second and third embodiments are operable is not particularly limited. Any exposure wavelength such as KrF excimer laser (248 nm), ArF excimer laser (193 nm) and $F_2$ laser (157 nm) is applicable. Particularly when the $F_2$ laser (157 nm) is used as the exposure wavelength, the halftone phase shift mask blanks and halftone phase shift masks (halftone phase shift films) of the second and third embodiments fully meet the required characteristics.

EXAMPLE

Examples and Comparative Examples are given below for illustrating the invention although the invention is not limited thereto.

It is noted that the flow rate ($cm^3$/min) of gas is standardized at 0° C. and 1013 hPa (one atmosphere).

Examples 1-3 and Comparative Examples 1-2 relate to the first embodiment of the invention.

Example 1

A multilayer phase shift film of the structure shown in FIG. 5 was prepared. For the deposition of a multilayer phase shift film, a DC sputtering system including two targets in a chamber was used.

First, a light-absorbing film 8a was deposited on a quartz substrate. The targets used were molybdenum and zirconium targets. Argon was fed into the chamber at a flow rate of 30 $cm^3$/min as a sputtering gas. During the gas feed, a gas pressure of 0.15 Pa was set in the sputtering chamber. By applying an electric discharge power of 1,000 W across the molybdenum target and a power of 50 W across the zirconium target for co-sputtering and rotating the substrate at 30 rpm, a metal film $Mo_{20}Zr$ was deposited on the substrate to a thickness of 15 Å.

Subsequently, a light-absorbing film 8b was deposited. Argon was fed at a flow rate of 30 $cm^3$/min so that a gas pressure of 0.15 Pa was set in the sputtering chamber. By applying a power of 50 W across the molybdenum target and a power of 1,000 W across the zirconium target for co-sputtering and rotating the substrate at 30 rpm, a metal film $MoZr_{20}$ was deposited on the first metal film to a thickness of 15 Å.

Next, a phase shifter film 9 was deposited. In another sputtering chamber containing a $MoSi_2$ target and a Si target, the substrate having the light-absorbing films deposited as above was placed. A gas mixture of 5 $cm^3$/min of Ar, 50 $cm^3$/min of $N_2$ and 1 $cm^3$/min of $O_2$ was fed as the sputtering gas. A gas pressure of 0.1 Pa was set in the sputtering chamber. A sputtering power of 200 W was applied across the $MoSi_2$ target and a power of 1,000 W applied across the Si target. Under these conditions, a material containing molybdenum and silicon, i.e., a saturated metal compound MoSiON was deposited to a thickness of about 800 Å. The remaining deposition conditions are the same as used for the light-absorbing film 8a. The thickness of the phase shifter film 9 was finely adjusted so that the multilayer phase shift film produced a phase difference of 180° at 193 nm (ArF).

The multilayer phase shift film was examined.

Two Stage Etching

An i-line resist was coated to the phase shift mask blank, exposed imagewise, and developed, forming a resist pattern. Through the patterned resist, the phase shifter film 9 was subjected to dry etching with $CF_4$ as a process gas. While a changing reflectance of the phase shifter film 9 being etched was monitored, the end of etching of the phase shifter film 9 was foreseen from the behavior of changing reflectance. Next, etching of the light-absorbing films 8b and 8a was carried out by dry etching with $Cl_2$ as a process gas. The end of etching was when the light-absorbing film 8a was consumed to expose the underlying quartz substrate. The end of etching of the light-absorbing film 8a was determined by monitoring a changing reflectance as above. After the dry etching, the residual resist was removed. The resulting phase shift mask was determined to have a phase difference in-plane distribution of 181.0±0.62 deg. The result proves uniform patterning over the entire surface.

Example 2

A multilayer phase shift film of the structure shown in FIG. 6 was prepared. For the deposition of a multilayer phase shift film, a DC sputtering system including two targets in a chamber was used.

First, a light-absorbing film 8a was deposited on a quartz substrate. The targets used were molybdenum and zirconium targets. Argon was fed into the chamber at a flow rate of 30 cm$^3$/min as a sputtering gas. During the gas feed, a gas pressure of 0.15 Pa was set in the sputtering chamber. By applying an electric discharge power of 1,000 W across the molybdenum target and a power of 50 W across the zirconium target for co-sputtering and rotating the substrate at 30 rpm, a metal film Mo$_{20}$Zr was deposited on the substrate to a thickness of 10 Å. Subsequently, a light-absorbing film 8b was deposited. Argon was fed at a flow rate of 30 cm$^3$/min so that a gas pressure of 0.15 Pa was set in the sputtering chamber. By applying a power of 50 W across the molybdenum target and a power of 1,000 W across the zirconium target for co-sputtering and rotating the substrate at 30 rpm, a metal film MoZr$_{20}$ was deposited to a thickness of 10 Å.

Next, a phase shifter film 9 was deposited. In another sputtering chamber containing a MoSi$_2$ target and a Si target, the substrate having the light-absorbing films deposited as above was placed. A gas mixture of 5 cm$^3$/min of Ar, 50 cm$^3$/min of N$_2$ and 1 cm$^3$/min of O$_2$ was fed as the sputtering gas. A gas pressure of 0.1 Pa was set in the sputtering chamber. A sputtering power of 200 W was applied across the MoSi$_2$ target and a power of 1,000 W applied across the Si target. A material containing molybdenum and silicon, i.e., a saturated metal compound MoSiON was deposited to a thickness of about 400 Å. The remaining deposition conditions are the same as used for the light-absorbing film 8a.

Next, an intermediate metal layer having a light absorbing function (second light-absorbing film) 10 was deposited. In the same depositing chamber as used for the phase shifter film 9, argon was fed at a flow rate of 30 cm$^3$/min so that a gas pressure of 0.15 Pa was set in the chamber. By applying a power of 200 W across the MoSi$_2$ target and a power of 1,000 W across the Si target, a molybdenum silicide film was deposited to a thickness of 20 Å. The remaining deposition conditions are the same as used for the light-absorbing film 8a.

Next, a phase shifter film 9 was deposited again. In the same sputtering chamber as above, a gas mixture of 5 cm$^3$/min of Ar, 50 cm$^3$/min of N$_2$ and 1 cm$^3$/min of O$_2$ was fed so that a gas pressure of 0.1 Pa was set in the chamber. A sputtering power of 200 W was applied across the MoSi$_2$ target and a power of 1,000 W applied across the Si target. A material containing molybdenum and silicon, i.e., a saturated metal compound MoSiON was deposited to a thickness of about 400 Å. The remaining deposition conditions are the same as used for the light-absorbing film 8a. The thickness of the phase shifter film 9 was finely adjusted so that the multilayer phase shift film produced a phase difference of 180° at 193 nm (ArF).

The multilayer phase shift film was examined.

Two Stage Etching

An i-line resist was coated to the phase shift mask blank, exposed imagewise, and developed, forming a resist pattern. Through the patterned resist, the phase shifter film 9 was subjected to dry etching with CF$_4$ as a process gas. While a changing reflectance of the phase shifter film 9 being etched was monitored, the end of etching of the phase shifter film 9 was foreseen from the behavior of changing reflectance. Next, etching of the light-absorbing films 8b and 8a was carried out by dry etching with Cl$_2$ as a process gas. The end of etching was when the light-absorbing film 8a was consumed to expose the underlying quartz substrate. The end of etching of the light-absorbing film 8a was determined by monitoring a changing reflectance as above. After the dry etching, the residual resist was removed. The resulting phase shift mask was determined to have a phase difference in-plane distribution of 180.7±0.48 deg. The result proves uniform patterning over the entire surface.

Example 3

A multilayer phase shift film of the structure shown in FIG. 7 was prepared. For the deposition of a multilayer phase shift film, a DC sputtering system including two targets in a chamber was used.

First, a light-absorbing film 8a was deposited on a quartz substrate. The targets used were MoSi$_9$ and ZrSi$_9$ targets. Ar and N$_2$ gases were fed into the chamber at a flow rate of 30 cm$^3$/min and 5 cm$^3$/min as sputtering gases, respectively. During the gas feed, a gas pressure of 0.15 Pa was set in the sputtering chamber. By applying an electric discharge power of 1,000 W across the MoSi$_9$ target and a power of 50 W across the ZrSi$_9$ target for co-sputtering and rotating the substrate at 30 rpm, an unsaturated metal compound film MoZrSiN was deposited on the substrate to a thickness of 30 Å. Subsequently, a light-absorbing film 8b was deposited. Ar and N$_2$ gases were fed into the chamber at a flow rate of 30 cm$^3$/min and 5 cm$^3$/min as sputtering gases, respectively, so that a gas pressure of 0.15 Pa was set in the sputtering chamber. By applying a power of 50 W across the MoSi$_9$ target and a power of 1,000 W across the ZrSi$_9$ target for co-sputtering and rotating the substrate at 30 rpm, an unsaturated metal compound film MoZrSiN was deposited to a thickness of 30 Å.

Next, a phase shifter film 9 was deposited. In the same sputtering chamber, a gas mixture of 5 cm$^3$/min of Ar, 50 cm$^3$/min of N$_2$ and 1 cm$^3$/min of O$_2$ was fed as the sputtering gas so that a gas pressure of 0.1 Pa was set in the chamber. A sputtering power of 1,000 W was applied across the MoSi$_9$ target and a power of 200 W applied across the ZrSi$_9$ target. A material containing molybdenum, zirconium and silicon, i.e., a saturated metal compound MoZrSiON was deposited to a thickness of about 300 Å. The remaining deposition conditions are the same as used for the light-absorbing film 8a.

Next, an intermediate metal layer having a light absorbing function (second light-absorbing film) 10 was deposited. Ar and N$_2$ gases were fed into the chamber at a flow rate of 30 cm$^3$/min and 5 cm$^3$/min as sputtering gases, respectively, so that a gas pressure of 0.15 Pa was set in the chamber. By applying a power of 1,000 W across the MoSi$_9$ target and a power of 200 W across the ZrSi$_9$ target for co-sputtering and rotating the substrate at 30 rpm, an unsaturated metal compound film MoZrSiN was deposited to a thickness of 30 Å. The remaining deposition conditions were the same as used for the light-absorbing film 8a.

Next, a phase shifter film 9 was deposited again. In the same sputtering chamber as above, a mixture of 5 cm$^3$/min of Ar, 50 cm$^3$/min of N$_2$ and 1 cm$^3$/min of O$_2$ was fed so that a gas pressure of 0.1 Pa was set in the chamber. A sputtering power of 1,000 W was applied across the MoSi$_9$ target and a power of 200 W applied across the ZrSi₉ target. A material containing molybdenum, zirconium and silicon, i.e., a saturated metal compound MoZrSiON was deposited to a thickness of about 300 Å. The remaining deposition conditions were the same as used for the light-absorbing film 8*a*.

Finally, a chemical resistant layer 11 was deposited. In the same sputtering chamber as above, a gas mixture of 5 cm³/min of Ar, 50 cm³/min of N₂ and 1 cm³/min of O₂ was fed so that a gas pressure of 0.1 Pa was set in the chamber. A sputtering power of 200 W was applied across the MoSi₉ target and a power of 1,000 W applied across the ZrSi₉ target. A material containing molybdenum, zirconium and silicon, i.e., a saturated metal compound MoZrSiON was deposited to a thickness of about 100 Å. The thickness of the phase shifter film 9 was finely adjusted so that the multilayer phase shift film produced a phase difference of 180° at 193 nm (ArF).

The multilayer phase shift film was examined.

One Stage Etching

An i-line resist was coated to the phase shift mask blank, exposed imagewise, and developed, forming a resist pattern. Through the patterned resist, the multilayer phase shift film 2 was subjected to dry etching with CF₄ as a process gas. While a changing reflectance of the phase shift film 2 being etched was monitored, the end of etching of the phase shift film 2 was foreseen from the behavior of changing reflectance. After the dry etching, the residual resist was removed. The resulting phase shift mask was determined to have a phase difference in-plane distribution of 181.2±0.72 deg. The result proves uniform patterning over the entire surface.

Comparative Example 1

Figure 12:
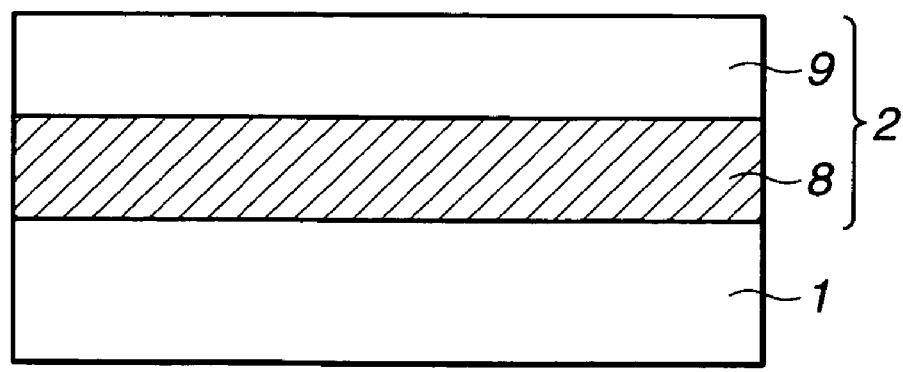
FIG. 12 is a cross-sectional view of an exemplary prior art halftone phase shift mask blank comprising a metal film having a light absorbing function and a phase shift function film.

A multilayer phase shift film of the structure shown in FIG. 12 was prepared. For the deposition of a multilayer phase shift film, a DC sputtering system including two targets in a chamber was used.

First, a light-absorbing film 8 was deposited on a quartz substrate. The targets used were molybdenum and zirconium targets. Argon was fed into the chamber at a flow rate of 30 cm³/min as a sputtering gas. During the gas feed, a gas pressure of 0.15 Pa was set in the sputtering chamber. By applying an electric discharge power of 50 W across the molybdenum target and a power of 1,000 W across the zirconium target for co-sputtering and rotating the substrate at 30 rpm, a metal film MoZr₂₀ was deposited on the substrate to a thickness of 30 Å.

Next, a phase shifter film 9 was deposited. In another sputtering chamber containing a MoSi₂ target and a Si target, the substrate having the light-absorbing film deposited as above was placed. A gas mixture of 5 cm³/min of Ar, 50 cm³/min of N₂ and 1 cm³/min of O₂ was fed as the sputtering gas. A gas pressure of 0.1 Pa was set in the sputtering chamber. A sputtering power of 200 W was applied across the MoSi₂ target and a power of 1,000 W applied across the Si target. Under these conditions, a material containing molybdenum and silicon, i.e., a saturated metal compound MoSiON was deposited to a thickness of about 800 Å. The remaining deposition conditions are the same as used for the light-absorbing film 8. The thickness of the phase shifter film 9 was finely adjusted so that the multilayer phase shift film produced a phase difference of 180° at 193 nm (ArF).

The multilayer phase shift film was examined.

Two Stage Etching

An i-line resist was coated to the phase shift mask blank, exposed imagewise, and developed, forming a resist pattern. Through the patterned resist, the phase shifter film 9 was subjected to dry etching with CF₄ as a process gas. While a changing reflectance of the phase shifter film 9 being etched was monitored, the end of etching of the phase shifter film 9 was foreseen from the behavior of changing reflectance. Next, etching of the light-absorbing film 8 was carried out by dry etching with Cl₂ as a process gas. The end of etching was when the light-absorbing film 8 was consumed to expose the underlying quartz substrate. The end of etching of the light-absorbing film 8 was determined by monitoring a changing reflectance as above. After the dry etching, the residual resist was removed. The resulting phase shift mask was determined to have a phase difference in-plane distribution of 182.3±1.79 deg. The phase difference distribution was expanded because the light absorbing film 8 had too low a dry etching rate to provide a selectivity ratio relative to the substrate.

Comparative Example 2

A multilayer phase shift film of the structure shown in FIG. 12 was prepared. For the deposition of a multilayer phase shift film, a DC sputtering system including two targets in a chamber was used.

First, a light-absorbing film 8 was deposited on a quartz substrate. The targets used were molybdenum and zirconium targets. Argon was fed into the chamber at a flow rate of 30 cm³/min as a sputtering gas. During the gas feed, a gas pressure of 0.15 Pa was set in the sputtering chamber. By applying an electric discharge power of 1,000 W across the molybdenum target and a power of 50 W across the zirconium target for co-sputtering and rotating the substrate at 30 rpm, a metal film Mo₂₀Zr was deposited on the substrate to a thickness of 30 Å.

Next, a phase shifter film 9 was deposited. In another sputtering chamber containing a MoSi₂ target and a Si target, the substrate having the light-absorbing film deposited as above was placed. A gas mixture of 5 cm³/min of Ar, 50 cm³/min of N₂ and 1 cm³/min of O₂ was fed as the sputtering gas. A gas pressure of 0.1 Pa was set in the sputtering chamber. A sputtering power of 200 W was applied across the MoSi₂ target and a power of 1,000 W applied across the Si target. Under these conditions, a material containing molybdenum and silicon, i.e., a saturated metal compound MoSiON was deposited to a thickness of about 800 Å. The remaining deposition conditions are the same as used for the light-absorbing film 8. The thickness of the phase shifter film 9 was finely adjusted so that the multilayer phase shift film produced a phase difference of 180° at 193 nm (ArF).

The multilayer phase shift film was examined.

One Stage Etching

An i-line resist was coated to the phase shift mask blank, exposed imagewise, and developed, forming a resist pattern. Through the patterned resist, the multilayer phase shift film 2 was subjected to dry etching with CF₄ as a process gas. While a changing reflectance of the phase shift film 2 being etched was monitored, the end of etching of the phase shift film 2 was foreseen from the behavior of changing reflectance. After the dry etching, the residual resist was removed. The resulting phase shift mask was determined to have a phase difference in-plane distribution of 182.6±2.72 deg. The phase difference distribution was expanded because the light absorbing film 8 had too high a dry etching rate to serve as an etching stop.

Examples 4-17 and Experiments 1-2 relate to the second and third embodiments of the invention.

Example 4

A halftone phase shift mask blank was obtained by depositing a halftone phase shift film of two layers on a synthetic quartz substrate of 6 inch square which was fully transparent to $F_2$ laser light (wavelength 157 nm).

For the deposition of a halftone phase shift film, a DC sputtering system was used. By disposing a mix target containing molybdenum, zirconium and silicon in a molar ratio Mo:Zr:Si of 5:1:20 ($Mo_5Zr_1Si_{20}$ target) and a silicon (Si) target and inducing binary co-sputtering, a halftone phase shift film was deposited.

Specifically, two layers of the halftone phase shift film were sequentially deposited such that a light-shielding layer (first layer) and a transparent layer (second layer) lay on the substrate in order while the following powers were applied across the $Mo_5Zr_1Si_{20}$ and Si targets.

Light-shielding (1st) layer
  $Mo_5Zr_1Si_{20}$ target: 200 W
  Si target: 800 W
Transparent (2nd) layer
  $Mo_5Zr_1Si_{20}$ target: 100 W
  Si target: 900 W Also, a reactive gas was fed to the chamber along with an inert gas to carry out reactive sputtering, depositing the halftone phase shift film.

Light-shielding (1st) layer
  Ar=20.0 SCCM
  $N_2$=10.0 SCCM
  $O_2$=4.0 SCCM
Transparent (2nd) layer
  Ar=5.0 SCCM
  $N_2$=50.0 SCCM
  $O_2$=4.0 SCCM The thickness of the light-shielding (first) layer and the transparent (second) layer was determined such that the overall halftone phase shift film had a transmittance of 6% and a phase difference of 180° at the $F_2$ laser wavelength (157 nm), while the influence of a thermally oxidized thin film to be formed on the transparent (second) layer was taken into account. Specifically, the thickness of the light-shielding (first) layer was 86 Å, the thickness of the transparent (second) layer was 649 Å, and the thickness of the overall halftone phase shift film was 735 Å.

Figure 19:
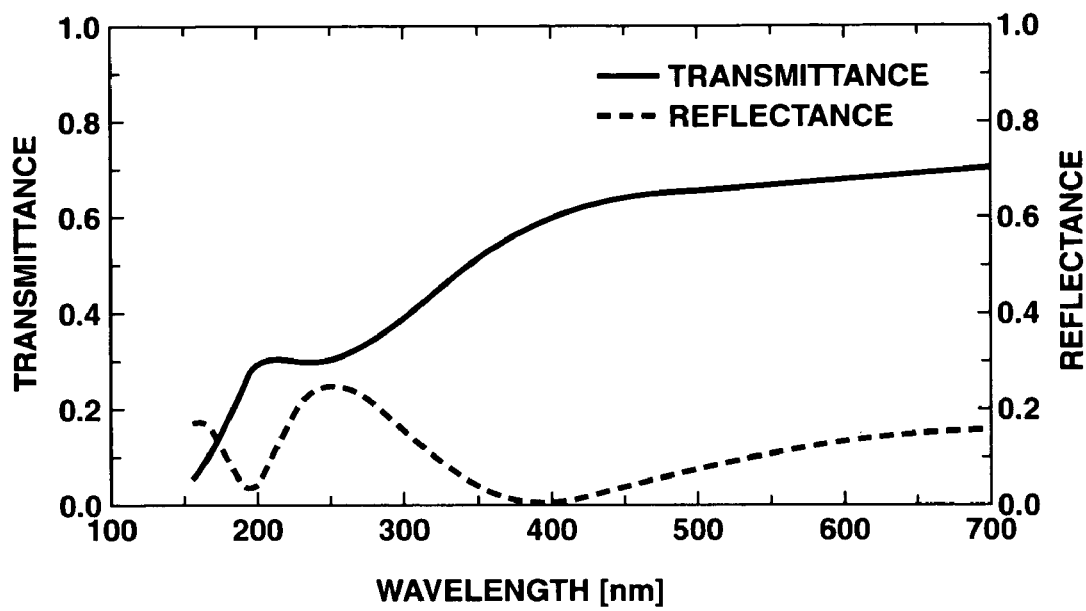
FIG. 19 is a diagram showing the spectral transmittance of a halftone phase shift mask blank in Example 1.
Figure 20:
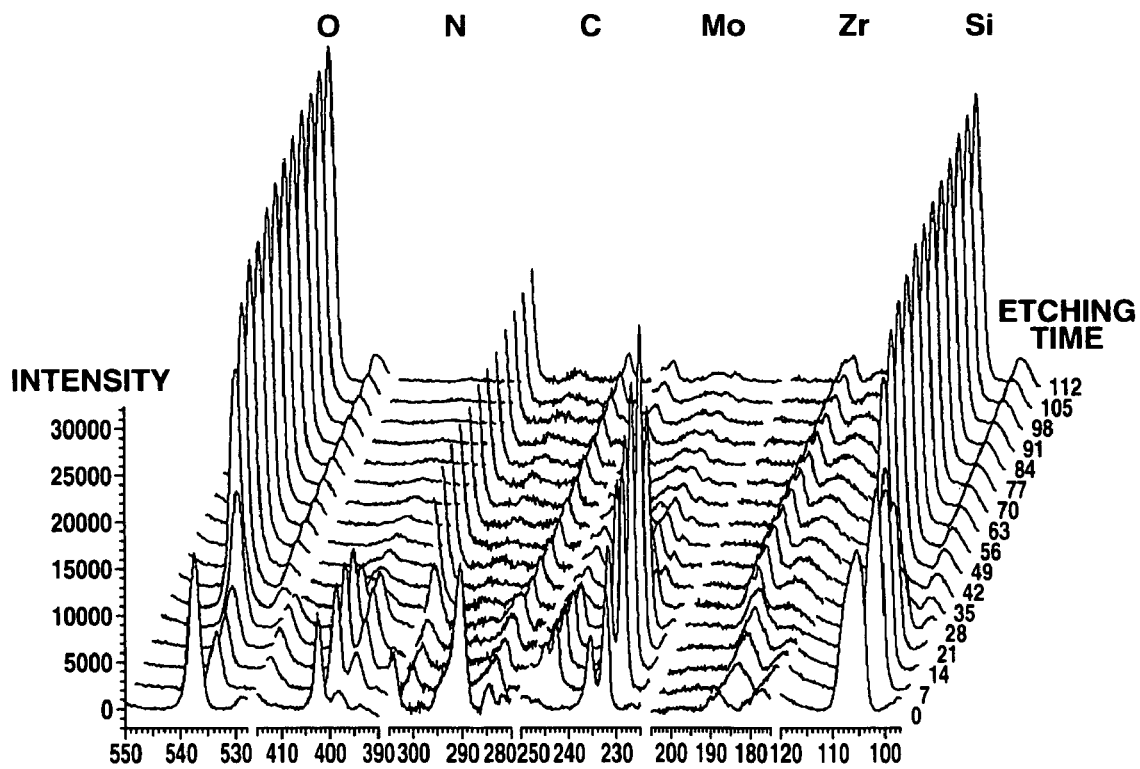
FIG. 20 is a chart showing the composition as analyzed by ESCA of a first layer on the halftone phase shift mask blank in Example 1.
Figure 21:
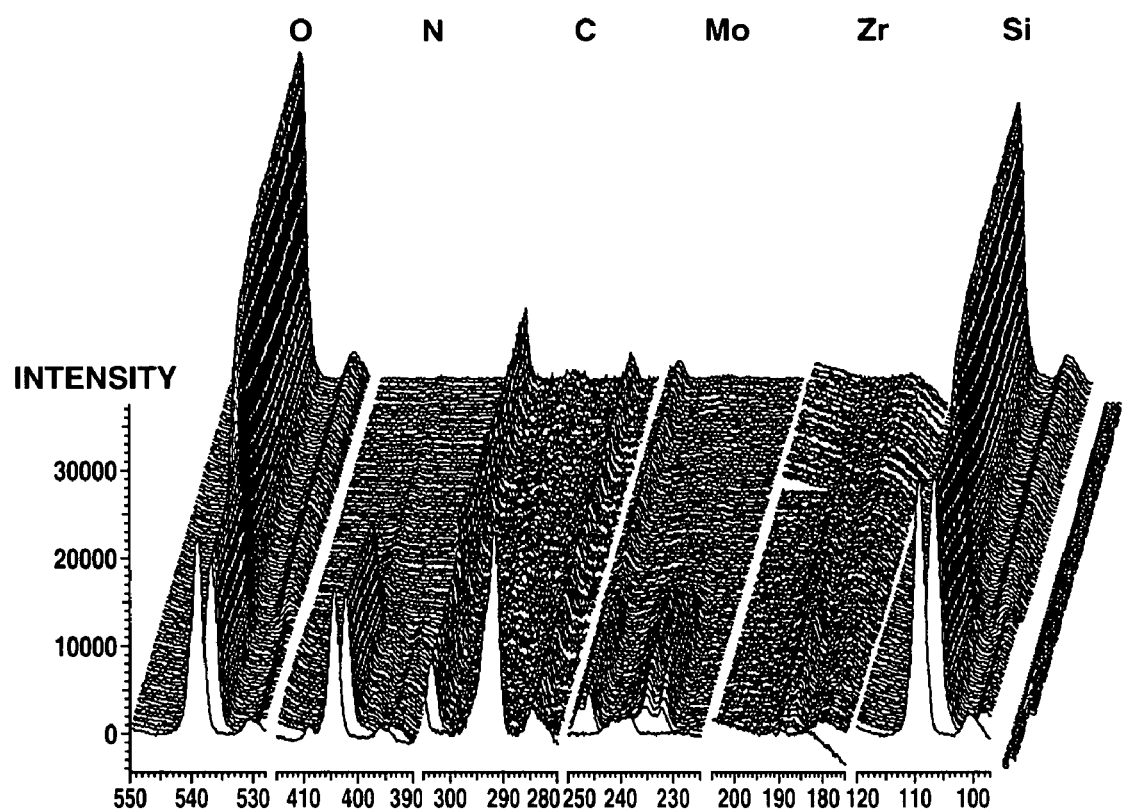
FIG. 21 is a chart showing the composition as analyzed by ESCA of a second layer on the halftone phase shift mask blank in Example 1.

The halftone phase shift film thus produced was analyzed. Its spectral transmittance data are shown in FIG. 19 and Table 1. The results of composition analysis by ESCA are shown in FIG. 20 (light-shielding or first layer), FIG. 21 (transparent or second layer) and Table 2. As seen from FIG. 19, the transmittance near 250 nm is suppressed low due to the interference between the reflected lights from the light-shielding (first) layer and the transparent (second) layer.

TABLE 1

| Phase difference (deg) | Transmittance (%) | | | | Film thickness |
|---|---|---|---|---|---|
| 157 nm | 157 nm | 193 nm | 257 nm | 266 nm | (Å) |
| 178.3 | 6.04 | 26.42 | 30.94 | 32.12 | 735 |

TABLE 2

|  | O | N | Mo | Zr | Si |
|---|---|---|---|---|---|
| 1st layer (at %) | 17.7 | 17.4 | 2.9 | 0.6 | 61.4 |
| 2nd layer (at %) | 45.5 | 16.2 | 0.4 | 0.1 | 37.8 |

The compositional ratios of Si, Mo and Zr in the light-shielding (first) layer and the transparent (second) layer of the halftone phase shift film were computed from the results of composition analysis.

Light-shielding (1st) layer
  Si=94.6 atom %, Mo=4.5 atom %, Zr=0.9 atom %
  (Mo+Zr)/Si=3.5/61.4=0.057
  Mo/Zr=2.9/0.6=4.8
Transparent (2nd) layer
  Si=98.7 atom %, Mo=1.0 atom %, Zr=0.3 atom %
  (Mo+Zr)/Si=0.5/37.8=0.013
  Mo/Zr=0.4/0.1=4.0

The compositional ratios of O and N relative to the total constituent elements in the light-shielding (first) layer and the transparent (second) layer were computed.

Light-shielding (1st) layer
  (O+N)/(Si+Mo+Zr+O+N)=0.351
Transparent (2nd) layer
  (O+N)/(Si+Mo+Zr+O+N)=0.617

The light-shielding (first) layer and the transparent (second) layer were separately deposited as a single layer. Each layer was measured for sheet resistance. Also the etching rate of each layer was measured by dry etching with fluorine-based gas or chlorine-based gas under the conditions shown below. The results are shown in Table 3. The extinction coefficient of each layer at 157 nm is also shown in Table 3.

Fluorine-based gas dry etching
  Resist: FEP171 (Fujifilm Arch Co., Ltd.)
  Resist thickness: 2500 Å
  Etching gas: $C_2F_6/O_2$/He=5/5/40 SCCM
  Pressure: 3 mTorr (0.4 Pa)
  Applied power: RIE=50 W, ICP=100 W
Chlorine-based gas dry etching
  Resist: FEP171 (Fujifilm Arch Co., Ltd.)
  Resist thickness: 2500 Å
  Etching gas: $Cl_2$/He=40/65 SCCM
  Pressure: 5 mTorr (0.67 Pa)
  Applied power: RIE=40 W, ICP=500 W

TABLE 3

|  | Sheet ($\Omega/\square$) | Etching rate (Å/min) | | Extinction coefficient |
|---|---|---|---|---|
|  |  | Fluorine | Chlorine |  |
| 1st layer | $3.90 \times 10^6$ | 218 | 277 | 1.42 |
| 2nd layer | $2.60 \times 10^{12}$ | 296 | 242 | 0.33 |

It is noted that the halftone phase shift mask blank obtained by depositing the light-shielding (first) layer and the transparent (second) layer according to the above procedure was heat treated in an oven at 300° C.

Next, a resist material was coated onto the halftone phase shift mask blank, exposed to electron beams, and developed with a developer, forming a resist pattern. By dry etching through the resist pattern as a protective film, the halftone phase shift film of the halftone phase shift mask blank was patterned. The dry etching was under the fluorine-based gas conditions. This resulted in a halftone phase shift mask having a satisfactory halftone phase shift film pattern.

Example 5

A halftone phase shift mask blank was obtained by depositing a halftone phase shift film of two layers on a synthetic quartz substrate of 6 inch square which was fully transparent to $F_2$ laser light (wavelength 157 nm).

For the deposition of a halftone phase shift film, a DC sputtering system was used. By disposing a mix target containing molybdenum, zirconium and silicon in a molar ratio Mo:Zr:Si of 5:1:20 ($Mo_5Zr_1Si_{20}$ target) and a silicon (Si) target and inducing binary co-sputtering, a halftone phase shift film was deposited.

Specifically, two layers of the halftone phase shift film were sequentially deposited such that a light-shielding layer (first layer) and a transparent layer (second layer) lay on the substrate in order while the following powers were applied across the $Mo_5Zr_1Si_{20}$ and Si targets.

Light-shielding (1st) layer
　　$Mo_5Zr_1Si_{20}$ target: 200 W
　　Si target: 800 W
Transparent (2nd) layer
　　$Mo_5Zr_1Si_{20}$ target: 200 W
　　Si target: 800 W Also, a reactive gas was fed to the chamber along with an inert gas to carry out reactive sputtering, depositing the halftone phase shift film.

Light-shielding (1st) layer
　　Ar=20.0 SCCM
　　$N_2$=15.0 SCCM
Transparent (2nd) layer
　　Ar=5.0 SCCM
　　$N_2$=50.0 SCCM
　　$O_2$=5.0 SCCM The thickness of the light-shielding (first) layer and the transparent (second) layer was determined such that the overall halftone phase shift film had a transmittance of 6% and a phase difference of 180° at the $F_2$ laser wavelength (157 nm), while the influence of a thermally oxidized thin film to be formed on the transparent (second) layer was taken into account. Specifically, the thickness of the light-shielding (first) layer was 64 Å, the thickness of the transparent (second) layer was 698 Å, and the thickness of the overall halftone phase shift film was 762 Å.

Figure 22:
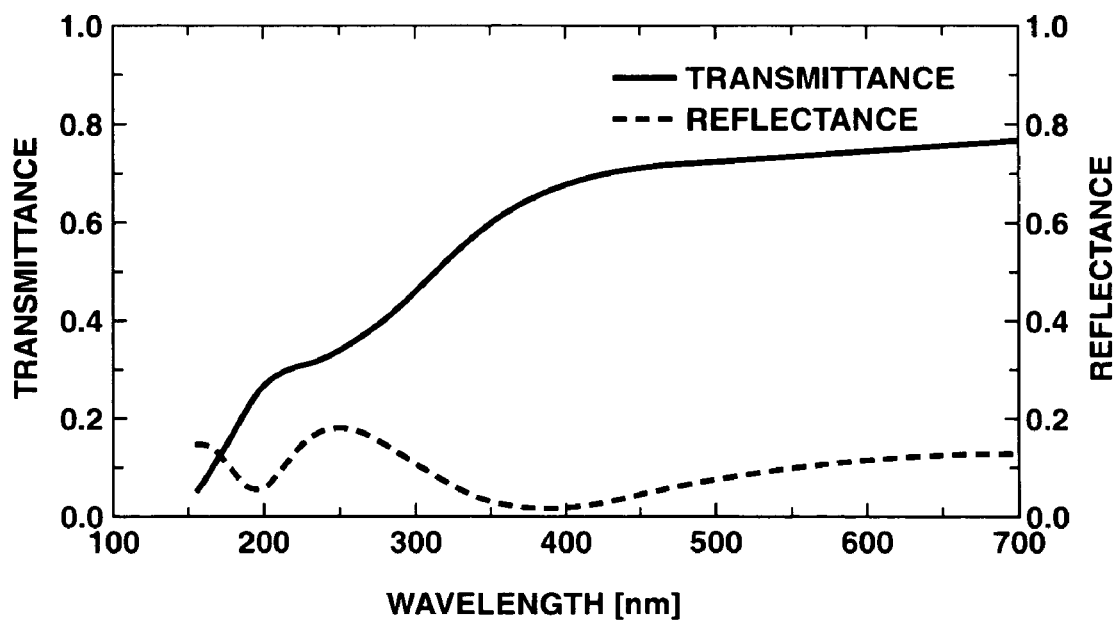
FIG. 22 is a diagram showing the spectral transmittance of a halftone phase shift mask blank in Example 2.

The halftone phase shift film thus produced was analyzed. Its spectral transmittance data are shown in FIG. 22 and Table 4. The results of composition analysis by ESCA are shown in Table 5. As seen from FIG. 22, the transmittance near 250 nm is suppressed low due to the interference between the reflected lights from the light-shielding (first) layer and the transparent (second) layer.

TABLE 4

| Phase difference (deg) | Transmittance (%) | | | | Film thickness |
|---|---|---|---|---|---|
| 157 nm | 157 nm | 193 nm | 257 nm | 266 nm | (Å) |
| 179.1 | 6.01 | 24.45 | 35.78 | 37.76 | 762 |

TABLE 5

| | O | N | Mo | Zr | Si |
|---|---|---|---|---|---|
| 1st layer (at %) | 1.8 | 15.1 | 3.9 | 0.8 | 78.4 |
| 2nd layer (at %) | 47.4 | 15.5 | 1.3 | 0.3 | 35.5 |

The compositional ratios of Si, Mo and Zr in the light-shielding (first) layer and the transparent (second) layer of the halftone phase shift film were computed from the results of composition analysis.

Light-shielding (1st) layer
　　Si=94.3 atom %, Mo=4.7 atom %, Zr=1.0 atom %
　　(Mo+Zr)/Si=4.7/78.4=0.060
　　Mo/Zr=3.9/0.8=4.9
Transparent (2nd) layer
　　Si=95.7 atom %, Mo=3.5 atom %, Zr=0.8 atom %
　　(Mo+Zr)/Si=1.6/35.5=0.045
　　Mo/Zr=1.3/0.3=4.3

The compositional ratios of O and N relative to the total constituent elements in the light-shielding (first) layer and the transparent (second) layer were computed.

Light-shielding (1st) layer
　　(O+N)/(Si+Mo+Zr+O+N)=0.169
Transparent (2nd) layer
　　(O+N)/(Si+Mo+Zr+O+N)=0.629

The extinction coefficient of the light-shielding (first) layer and the transparent (second) layer at 157 nm is shown in Table 6.

TABLE 6

| | Extinction coefficient |
|---|---|
| 1st layer | 1.57 |
| 2nd layer | 0.34 |

The halftone phase shift mask blank obtained by depositing the light-shielding (first) layer and the transparent (second) layer according to the above procedure was heat treated as in Example 4.

Next, as in Example 4, a resist pattern was formed on the halftone phase shift mask blank, and the halftone phase shift film was then patterned by dry etching under the fluorine-based gas conditions. This resulted in a halftone phase shift mask having a satisfactory halftone phase shift film pattern.

Experiment 1

In dry etching of halftone phase shift films containing silicon and metal as constituent elements, it was examined how the dry etching rate varied when the ratio of Si to the sum of Si and metal was changed. The ratio is referred to as silicon proportion and calculated as [Si/(Si+metal)]×100%.

A halftone phase shift mask blank having a halftone phase shift film containing a proportion (shown in Table 7) of silicon and metal was dry etched under the following conditions. An etching rate was determined and calculated based on an etching rate of 1 for the film having a silicon proportion of 67 atom %.

Dry etching
　　Etching gas: $C_2F_6$=50 SCCM
　　Pressure: 5 mTorr (0.67 Pa)
　　Applied power: RIE=150 W, ICP=300 W

TABLE 7

| | Relative dry etching rate | | |
|---|---|---|---|
| Silicon proportion | Nitride film | Oxynitride film | Oxide film |
| 67% | 1 | 1 | 1 |
| 80% | 1.25 | 1.40 | 1.02 |
| 90% | 2.51 | 1.63 | 1.42 |
| 100% | 3.36 | 3.23 | 1.93 |

The data reveal that the higher the silicon proportion, the higher becomes the dry etching rate. Higher silicon proportions are preferred for processability.

Experiment 2

For halftone phase shift films containing silicon, molybdenum and zirconium as constituent elements, it was examined how the sheet resistance varied when the ratio of Si to the sum of Si, Mo and Zr was changed. The ratio is referred to as silicon proportion and calculated as [Si/(Si+Mo+Zr)]×100%.

A halftone phase shift film was deposited on a synthetic quartz substrate of 6 inch square which was fully transparent to $F_2$ laser light (wavelength 157 nm). A DC sputtering system was used. Two targets were used in a combination of a mix target containing molybdenum and silicon in a molar ratio Mo:Si of 1:9 ($Mo_1Si_9$ target) and another mix target containing zirconium and silicon in a molar ratio Zr:Si of 1:9 ($Zr_1Si_9$ target) or a combination of a mix target containing molybdenum, zirconium and silicon in a molar ratio Mo:Zr:Si of 5:1:20 ($Mo_5Zr_1Si_{20}$ target) and a silicon (Si) target. Binary co-sputtering was carried out while applying properly controlled powers across the targets. During the deposition, a reactive gas which was oxygen gas or a mixture of nitrogen and oxygen gases was fed into the chamber at a flow rate as shown in Tables 8 and 9. Through reactive sputtering, a halftone phase shift film was deposited. In this way, halftone phase shift films of varying compositions were deposited to produce a series of halftone phase shift mask blanks.

The sheet resistance of the mask blanks is also shown in Tables 8 and 9.

TABLE 8

| Silicon proportion | Mo/Zr | Gas flow rate (SCCM) | | | Sheet resistance ($\Omega/cm^2$) |
|---|---|---|---|---|---|
| | | Ar | $N_2$ | $O_2$ | |
| 90% | 1 | 40 | — | 1-2 | $1.0 \times 10^5$-$3.0 \times 10^6$ |
| 95% | 1 | 40 | — | 1-2 | $1.0 \times 10^6$-$5.0 \times 10^7$ |
| 99% | 1 | 40 | — | 1-2 | $1.0 \times 10^7$-$1.0 \times 10^{10}$ |
| 100% | — | 40 | — | 1-2 | $5.0 \times 10^{11}$-$1.0 \times 10^{13}$ |

TABLE 9

| Silicon proportion | Mo/Zr | Gas flow rate (SCCM) | | | Sheet resistance ($\Omega/cm^2$) |
|---|---|---|---|---|---|
| | | Ar | $N_2$ | $O_2$ | |
| 90% | 5 | 5 | 20 | 0-2 | $1.0 \times 10^{11}$-$3.0 \times 10^{12}$ |
| 95% | 5 | 5 | 20 | 0-2 | $5.0 \times 10^{11}$-$8.0 \times 10^{12}$ |
| 99% | 5 | 5 | 20 | 0-2 | $1.0 \times 10^{12}$-$2.0 \times 10^{13}$ |
| 100% | — | 5 | 20 | 0-2 | unmeasurable |

The data reveal that the higher the silicon proportion, the higher becomes the sheet resistance. Although it is evident from the data of Experiment 1 that higher silicon proportions are advantageous for processability, it is preferred that the silicon proportion be suppressed a few percents in order to provide a sufficient conductivity to prevent dielectric breakdown or a charge build-up in SEM for line width measurement.

A combined review of Experiments 1 and 2 shows that a silicon proportion of 90 to 99 atom % is preferred.

Examples 6-14

A halftone phase shift mask blank was obtained by depositing a halftone phase shift film of two layers on a synthetic quartz substrate of 6 inch square which was fully transparent to $F_2$ laser light (wavelength 157 nm).

For the deposition of a halftone phase shift film, a DC sputtering system was used. In Examples 6 to 10, binary co-sputtering was carried out using two targets: a mix target containing molybdenum and silicon in a molar ratio Mo:Si of 1:9 ($Mo_1Si_9$ target) and another mix target containing zirconium and silicon in a molar ratio Zr:Si of 1:9 ($Zr_1Si_9$ target). In Examples 11 to 14, binary co-sputtering was carried out using three targets: a mix target containing molybdenum and silicon in a molar ratio Mo:Si of 1:9 ($Mo_1Si_9$ target), another mix target containing zirconium and silicon in a molar ratio Zr:Si of 1:9 ($Zr_1Si_9$ target), and a silicon target.

Specifically, two layers of the halftone phase shift film were sequentially deposited such that a light-shielding layer (first layer) and a transparent layer (second layer) lay on the substrate in order while the powers shown in Table 10 were applied across the $Mo_1Si_9$, $Zr_1Si_9$ and Si targets.

Also, a reactive gas was fed to the chamber along with an inert gas to carry out reactive sputtering, depositing the halftone phase shift film.

1st layer
    Ar=30.0 SCCM
    $N_2$=5.0 SCCM
    $O_2$=0.3-0.5 SCCM

2nd layer
    Ar=20.0 SCCM
    $N_2$=20.0 SCCM
    $O_2$=2.0-2.5 SCCM

The thickness of the light-shielding (first) layer and the transparent (second) layer was determined such that the overall halftone phase shift film had a transmittance of 6% and a phase difference of 180° at the $F_2$ laser wavelength (157 nm). The thickness of the overall halftone phase shift film is shown in Table 10.

TABLE 10

| | | Target applied power (W) | | | Composition (at %) | | | Mo/Zr atomic ratio | Thickness (Å) |
|---|---|---|---|---|---|---|---|---|---|
| | | $Mo_1Si_9$ | $Zr_1Si_9$ | Si | Si | Mo | Zr | | |
| Example 6 | 1st layer | 225 | 75 | — | 90 | 7.5 | 2.5 | 3 | 914 |
| | 2nd layer | 225 | 75 | — | 90 | 7.5 | 2.5 | 3 | |
| Example 7 | 1st layer | 240 | 60 | — | 90 | 8.0 | 2 | 4 | 949 |
| | 2nd layer | 240 | 60 | — | 90 | 8.0 | 2 | 4 | |
| Example 8 | 1st layer | 250 | 50 | — | 90 | 8.3 | 1.7 | 5 | 932 |
| | 2nd layer | 250 | 50 | — | 90 | 8.3 | 1.7 | 5 | |
| Example 9 | 1st layer | 255 | 45 | — | 90 | 8.6 | 1.4 | 6 | 912 |
| | 2nd layer | 255 | 45 | — | 90 | 8.6 | 1.4 | 6 | |
| Example 10 | 1st layer | 260 | 40 | — | 90 | 8.8 | 1.2 | 7 | 897 |
| | 2nd layer | 260 | 40 | — | 90 | 8.8 | 1.2 | 7 | |
| Example 11 | 1st layer | 125 | 25 | 150 | 95 | 4.2 | 0.8 | 5 | 812 |
| | 2nd layer | 125 | 25 | 150 | 95 | 4.2 | 0.8 | 5 | |
| Example 12 | 1st layer | 130 | 20 | 150 | 95 | 4.3 | 0.7 | 6 | 808 |
| | 2nd layer | 130 | 20 | 150 | 95 | 4.3 | 0.7 | 6 | |
| Example | 1st layer | 131 | 19 | 150 | 95 | 4.4 | 0.6 | 7 | 788 |

TABLE 10-continued

|  |  | Target applied power (W) | | Composition (at %) | | | | Mo/Zr atomic | Thickness |
|---|---|---|---|---|---|---|---|---|---|
|  |  | Mo$_1$Si$_9$ | Zr$_1$Si$_9$ | Si | Si | Mo | Zr | ratio | (Å) |
| 13 | 2nd layer | 131 | 19 | 150 | 95 | 4.4 | 0.6 | 7 |  |
| Example | 1st layer | 135 | 15 | 150 | 95 | 4.5 | 0.5 | 9 | 795 |
| 14 | 2nd layer | 135 | 15 | 150 | 95 | 4.5 | 0.5 | 9 |  |

A chemical resistance test was carried out on the halftone phase shift films under the conditions A and B shown below. Changes of phase difference and transmittance before and after the test were determined. Table 11 shows the results under condition A and Table 12 shows the results under condition B.

Chemical Resistance Test
 Condition A: SPM
  immersed in a 1:4 (volume ratio) mixture of sulfuric acid/hydrogen peroxide at 80° C. for one hour
 Condition B: APM
  immersed in a 1:3:15 (volume ratio) mixture of ammonium hydroxide/hydrogen peroxide/deionized water at 35° C. for one hour

TABLE 11

| Condition A: | Phase difference (°) | | | Transmittance (%) | | |
|---|---|---|---|---|---|---|
| SPM | Before | After | Change | Before | After | Change |
| Example 6 | 177.1 | 176.8 | <3.0 | 6.00 | 6.02 | <0.5 |
| Example 7 | 178.3 | 178.2 | <3.0 | 5.78 | 5.93 | <0.5 |
| Example 8 | 177.6 | 177.1 | <3.0 | 6.02 | 6.13 | <0.5 |
| Example 9 | 179.3 | 179.0 | <3.0 | 5.88 | 5.95 | <0.5 |
| Example 10 | 176.9 | 176.2 | <3.0 | 5.80 | 5.83 | <0.5 |
| Example 11 | 178.5 | 178.4 | <3.0 | 6.04 | 6.11 | <0.5 |
| Example 12 | 177.7 | 177.4 | <3.0 | 5.95 | 6.02 | <0.5 |
| Example 13 | 176.3 | 175.9 | <3.0 | 6.05 | 6.19 | <0.5 |
| Example 14 | 179.1 | 178.8 | <3.0 | 5.81 | 5.97 | <0.5 |

TABLE 12

| Condition B: | Phase difference (°) | | | Transmittance (%) | | |
|---|---|---|---|---|---|---|
| APM | Before | After | Change | Before | After | Change |
| Example 6 | 177.1 | 176.1 | <3.0 | 6.00 | 6.21 | <0.5 |
| Example 7 | 178.3 | 176.5 | <3.0 | 5.78 | 6.10 | <0.5 |
| Example 8 | 177.6 | 175.2 | <3.0 | 6.02 | 6.37 | <0.5 |
| Example 9 | 179.3 | 175.7 | >3.0 | 5.88 | 6.48 | >0.5 |
| Example 10 | 176.9 | 171.6 | >3.0 | 5.80 | 6.54 | >0.5 |
| Example 11 | 178.5 | 177.3 | <3.0 | 6.04 | 6.19 | <0.5 |
| Example 12 | 177.7 | 175.7 | <3.0 | 5.95 | 6.27 | <0.5 |
| Example 13 | 176.3 | 172.8 | >3.0 | 6.05 | 6.58 | >0.5 |
| Example 14 | 179.1 | 174.5 | >3.0 | 5.81 | 6.43 | >0.5 |

For halftone phase shift films of halftone phase shift mask blanks containing silicon, molybdenum and zirconium as constituent elements, their resistance to alkaline cleaning liquid such as APM is crucial.

As seen from the above results, when the ratio of Si to the sum of Si, Mo and Zr, referred to silicon proportion, is 90 atom % or higher, an atomic ratio Mo/Zr≦5 ensures a change of phase difference of less than 3.0 degrees and a change of transmittance of less than 0.5% in the alkaline cleaning liquid test. The contents of Mo and Zr that satisfy an atomic ratio Mo/Zr≦5 are Mo≦8.3 atom % and Zr≧1.7 atom % for the silicon proportion of 90 atom %; and Mo≦0.83 atom % and Zr≧0.17 atom % for the silicon proportion of 99 atom %.

When the ratio of Si to the sum of Si, Mo and Zr, referred to silicon proportion, is 95 atom % or higher, an atomic ratio Mo/Zr≦6 ensures a change of phase difference of less than 3.0 degrees and a change of transmittance of less than 0.5% in the alkaline cleaning liquid test. The contents of Mo and Zr that satisfy an atomic ratio Mo/Zr≦6 are Mo≦4.3 atom % and Zr≧0.7 atom % for the silicon proportion of 95 atom %; and Mo≦0.85 atom % and Zr≧0.15 atom % for the silicon proportion of 99 atom %.

Example 15

A halftone phase shift mask blank was obtained by depositing a halftone phase shift film of two layers on a synthetic quartz substrate of 6 inch square which was fully transparent to F$_2$ laser light (wavelength 157 nm).

For the deposition of a halftone phase shift film, a DC sputtering system was used. For the light-shielding (first) layer, binary co-sputtering was carried out using two targets: a mix target containing molybdenum and silicon in a molar ratio Mo:Si of 1:9 (Mo$_1$Si$_9$ target) and another mix target containing zirconium and silicon in a molar ratio Zr:Si of 1:9 (Zr$_1$Si$_9$ target). For the transparent (second) layer, sputtering was carried out using a silicon target.

Specifically, two layers of the halftone phase shift film were sequentially deposited such that a light-shielding layer (first layer) and a transparent layer (second layer) lay on the substrate in order while the following powers were applied across the Mo$_1$Si$_9$, Zr$_1$Si$_9$ and Si targets.

Light-shielding (1st) layer
 Mo$_1$Si$_9$ target: 150 W
 Zr$_1$Si$_9$ target: 150 W
Transparent (2nd) layer
 Si target: 250 W Also, a reactive gas was fed to the chamber along with an inert gas to carry out reactive sputtering, depositing the halftone phase shift film.

Light-shielding (1st) layer
 Ar=30.0 SCCM
 N$_2$=8.0 SCCM
Transparent (2nd) layer
 Ar=5.0 SCCM
 N$_2$=20.0 SCCM
 O$_2$=0.5 SCCM The thickness of the light-shielding (first) layer and the transparent (second) layer was determined such that the overall halftone phase shift film had a transmittance of 6% and a phase difference of 180° at the F$_2$ laser wavelength (157 nm). Specifically, the thickness of the light-shielding (first) layer was 75 Å, the thickness of the transparent (second) layer was 648 Å, and the thickness of the overall halftone phase shift film was 723 Å.

Figure 23:
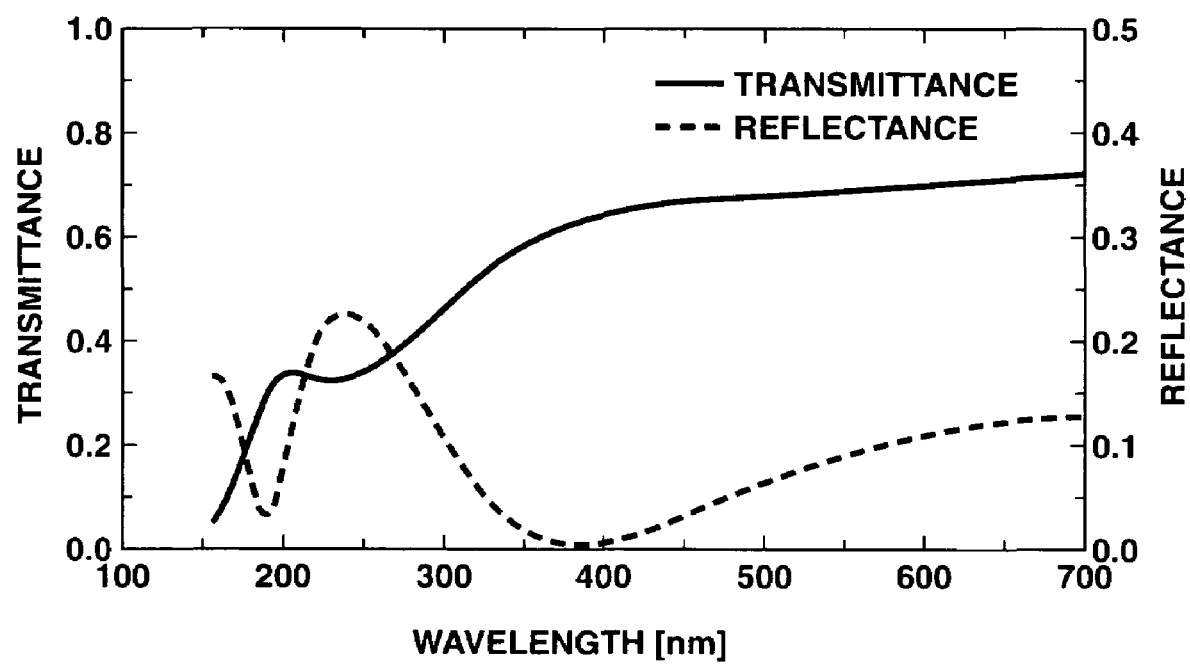
FIG. 23 is a diagram showing the spectral transmittance of a halftone phase shift mask blank in Example 12.

The halftone phase shift film thus produced was analyzed. Its spectral transmittance data are shown in FIG. 23 and Table 13. As seen from FIG. 23, the transmittance near 250 nm is suppressed low due to the interference between the reflected lights from the light-shielding (first) layer and the transparent (second) layer.

TABLE 13

| Phase difference (deg) | Transmittance (%) | | | | Film thickness |
|---|---|---|---|---|---|
| 157 nm | 157 nm | 193 nm | 257 nm | 266 nm | (Å) |
| 175.3 | 6.01 | 34.2 | 32.5 | 36.0 | 723 |

From the compositions of the targets and the powers applied across the targets, the compositional ratios of Si, Mo and Zr in the light-shielding (first) layer of the halftone phase shift film were approximately estimated below.

Light-shielding (1st) layer
Si=90.0 atom %, Mo=5.0 atom %, Zr=5.0 atom %
(Mo+Zr)/Si=10.0/90.0=0.1
Mo/Zr=5.0/5.0=1

The halftone phase shift mask blank obtained by depositing the light-shielding (first) layer and the transparent (second) layer according to the above procedure was heat treated as in Example 4.

Next, as in Example 4, a resist pattern was formed on the halftone phase shift mask blank, and the halftone phase shift film was then patterned by dry etching under the fluorine-based gas conditions. This resulted in a halftone phase shift mask having a satisfactory halftone phase shift film pattern.

Example 16

A halftone phase shift mask blank was obtained by depositing a halftone phase shift film of two layers on a synthetic quartz substrate of 6 inch square which was fully transparent to $F_2$ laser light (wavelength 157 nm).

For the deposition of a halftone phase shift film, a DC sputtering system was used. For the light-shielding (first) layer, binary co-sputtering was carried out using two targets: a mix target containing molybdenum, zirconium and silicon in a molar ratio Mo:Zr:Si of 5:1:20 ($Mo_5Zr_1Si_{20}$ target) and a silicon target. For the transparent (second) layer, sputtering was carried out using a silicon target.

Specifically, two layers of the halftone phase shift film were sequentially deposited such that a light-shielding layer (first layer) and a transparent layer (second layer) lay on the substrate in order while the following powers were applied across the $Mo_5Zr_1Si_{20}$ and Si targets.

Light-shielding (1st) layer
$Mo_5Zr_1Si_{20}$ target: 200 W
Si target: 800 W
Transparent (2nd) layer
Si target: 1000 W Also, a reactive gas was fed to the chamber along with an inert gas to carry out reactive sputtering, depositing the halftone phase shift film.

Light-shielding (1st) layer
Ar=20.0 SCCM
$N_2$=10.0 SCCM
$O_2$=4.0 SCCM
Transparent (2nd) layer
Ar=5.0 SCCM
$N_2$=20.0 SCCM
$O_2$=0.5 SCCM The thickness of the light-shielding (first) layer and the transparent (second) layer was determined such that the overall halftone phase shift film had a transmittance of 6% and a phase difference of 180° at the $F_2$ laser wavelength (157 nm), while the influence of a thermally oxidized thin film to be formed on the transparent (second) layer was taken into account. Specifically, the thickness of the light-shielding (first) layer was 98 Å, the thickness of the transparent (second) layer was 651 Å, and the thickness of the overall halftone phase shift film was 749 Å.

The spectral transmittance data of the halftone phase shift film are shown in Table 14. The results of composition analysis by ESCA are shown in Table 15.

TABLE 14

| Phase difference (deg) | Transmittance (%) | | | | Film thickness |
|---|---|---|---|---|---|
| 157 nm | 157 nm | 193 nm | 257 nm | 266 nm | (Å) |
| 176.9 | 6.01 | 32.65 | 31.57 | 32.58 | 749 |

TABLE 15

| | O | N | Mo | Zr | Si |
|---|---|---|---|---|---|
| 1st layer (at %) | 32.9 | 13.4 | 2.8 | 0.6 | 50.3 |
| 2nd layer (at %) | 25.3 | 24.6 | — | — | 50.1 |

The compositional ratios of Si, Mo and Zr in the light-shielding (first) layer of the halftone phase shift film were computed from the results of composition analysis.

Light-shielding (1st) layer
Si=93.7 atom %, Mo=5.2 atom %, Zr=1.1 atom %
(Mo+Zr)/Si=3.4/50.3=0.068
Mo/Zr=2.8/0.6=4.7

The compositional ratios of O and N relative to the total constituent elements in the light-shielding (first) layer and the transparent (second) layer were computed.

Light-shielding (1st) layer
(O+N)/(Si+Mo+Zr+O+N)=0.463
Transparent (2nd) layer
(O+N)/(Si+O+N)=0.499

The extinction coefficient of the light-shielding (first) layer and the transparent (second) layer at 157 nm is shown in Table 16.

TABLE 16

| | Extinction coefficient |
|---|---|
| 1st layer | 1.42 |
| 2nd layer | 0.34 |

The halftone phase shift mask blank obtained by depositing the light-shielding (first) layer and the transparent (second) layer according to the above procedure was heat treated as in Example 4.

Next, as in Example 4, a resist pattern was formed on the halftone phase shift mask blank, and the halftone phase shift film was then patterned by dry etching under the fluorine-based gas conditions. This resulted in a halftone phase shift mask having a satisfactory halftone phase shift film pattern.

Example 17

A halftone phase shift mask blank was obtained by depositing a halftone phase shift film of two layers on a synthetic quartz substrate of 6 inch square which was fully transparent to $F_2$ laser light (wavelength 157 nm).

For the deposition of a halftone phase shift film, a DC sputtering system was used. Binary co-sputtering was carried out on two targets: a mix target containing molybdenum, hafnium and silicon in a molar ratio Mo:Hf:Si of 5:1:20 ($Mo_5Hf_1Si_{20}$ target) and a silicon target, depositing a halftone phase shift film.

Specifically, two layers of the halftone phase shift film were sequentially deposited such that a light-shielding layer (first layer) and a transparent layer (second layer) lay on the substrate in order while the following powers were applied across the $Mo_5Hf_1Si_{20}$ and Si targets.

Light-shielding (1st) layer
  $Mo_5Hf_1Si_{20}$ target: 200 W
  Si target: 800 W
Transparent (2nd) layer
  $Mo_5Hf_1Si_{20}$ target: 100 W
  Si target: 900 W Also, a reactive gas was fed to the chamber along with an inert gas to carry out reactive sputtering, depositing the halftone phase shift film.

Light-shielding (1st) layer
  Ar=20.0 SCCM
  $N_2$=15.0 SCCM
Transparent (2nd) layer
  Ar=5.0 SCCM
  $N_2$=50.0 SCCM
  $O_2$=4.0 SCCM The thickness of the light-shielding (first) layer and the transparent (second) layer was determined such that the overall halftone phase shift film had a transmittance of 6% and a phase difference of 180° at the $F_2$ laser wavelength (157 nm). Specifically, the thickness of the light-shielding (first) layer was 82 Å, the thickness of the transparent (second) layer was 637 Å, and the thickness of the overall halftone phase shift film was 719 Å.

The spectral transmittance data of the halftone phase shift film are shown in Table 17. The results of composition analysis by ESCA are shown in Table 18.

TABLE 17

| Phase difference (deg) | Transmittance (%) | | | | Film thickness (Å) |
| --- | --- | --- | --- | --- | --- |
| 157 nm | 157 nm | 193 nm | 257 nm | 266 nm | |
| 178.2 | 6.04 | 26.56 | 35.53 | 37.74 | 719 |

TABLE 18

| | O | N | Mo | Hf | Si |
| --- | --- | --- | --- | --- | --- |
| 1st layer (at %) | 1.8 | 15.1 | 3.9 | 0.8 | 78.4 |
| 2nd layer (at %) | 42.5 | 15.1 | 0.4 | 0.1 | 35.3 |

The compositional ratios of Si, Mo and Hf in the light-shielding (first) layer and the transparent (second) layer of the halftone phase shift film were computed from the results of composition analysis.

Light-shielding (1st) layer
  Si=94.3 atom %, Mo=4.7 atom %, Hf=1.0 atom %
  (Mo+Hf)/Si=4.7/78.4=0.060
  Mo/Hf=3.9/0.8=4.9
Transparent (2nd) layer
  Si=98.6 atom %, Mo=1.1 atom %, Hf=0.3 atom %
  (Mo+Hf)/Si=0.5/35.3=0.014
  Mo/Hf=0.4/0.1=4.0

The compositional ratios of O and N relative to the total constituent elements in the light-shielding (first) layer and the transparent (second) layer were computed.

Light-shielding (1st) layer
  (O+N)/(Si+Mo+Hf+O+N)=0.169
Transparent (2nd) layer
  (O+N)/(Si+Mo+Hf+O+N)=0.576

The halftone phase shift mask blank obtained by depositing the light-shielding (first) layer and the transparent (second) layer according to the above procedure was heat treated as in Example 4.

Next, as in Example 4, a resist pattern was formed on the halftone phase shift mask blank, and the halftone phase shift film was then patterned by dry etching under the fluorine-based gas conditions. This resulted in a halftone phase shift mask having a satisfactory halftone phase shift film pattern.

Japanese Patent Application Nos. 2004-102219, 2004-102388 and 2004-102427 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A halftone phase shift mask blank of multilayer structure comprising a substrate, a film having a main function of light absorption on the substrate, and a film of at least one layer having a main function of phase shift on the light absorbing function film, wherein
    said light absorbing function film includes an upper region adjacent the phase shift function film and a lower region adjacent the substrate and contains a metal element of Group 4A in such a distribution that the light absorbing function film has a higher content of said metal element in the upper region than in the lower region.

2. The halftone phase shift mask blank of claim 1, wherein the metal element of Group 4A is zirconium and/or hafnium.

3. The halftone phase shift mask blank of claim 1, wherein the light absorbing function film further comprises at least one metal element other than the metal element of Group 4A.

4. The halftone phase shift mask blank of claim 3, wherein the metal element other than the metal element of Group 4A is molybdenum and/or tantalum.

5. The halftone phase shift mask blank of claim 1, wherein the light absorbing function film further comprises silicon.

6. The halftone phase shift mask blank of claim 5, wherein the light absorbing function film further comprises oxygen, nitrogen, or oxygen and nitrogen.

7. The halftone phase shift mask blank of claim 1, further comprising a second light absorbing film intervening in the phase shift function film, said second film being of a material which is identical with or different from the light absorbing function film.

8. A phase shift mask obtained by patterning the phase shift mask blank of claim 1.

9. A pattern transfer method using the phase shift mask of claim 8.

10. A halftone phase shift mask blank comprising a substrate which is transparent to exposure light and a halftone phase shift film thereon having a preselected phase difference and transmittance, said halftone phase shift film being composed of a single layer or multiple layers, wherein at least one layer of said halftone phase shift film comprises silicon and a plurality of metal elements as constituent elements, the content of silicon is 90 to 99 atom % based on the total of silicon and said metal elements, the plurality of metal elements consists of a first metal component of molybdenum and a second metal component of zirconium, hafnium or both, and an atomic ratio of the first metal component to the second metal component is up to 5.

11. The halftone phase shift mask blank of claim 10, wherein the first metal component and the second metal component are up to 8.3 atom %, and at least 0.15 atom %, respectively, based on the total of silicon and the first and second metal components, provided that the total is 100 atom %.

12. The halftone phase shift mask blank of claim 10, wherein said at least one layer comprising silicon and, a plurality of metal elements further comprises at least one element selected from the group consisting of hydrogen, oxygen, nitrogen, carbon and halogen, as a constituent element.

13. A halftone phase shift mask adapted for KrF excimer laser, ArF excimer laser or $F_2$ laser exposure, the mask being obtained by patterning the halftone phase shift film in the phase shift mask blank of claim 10.

14. A pattern transfer method comprising exposing a photoresist to a pattern of light through the halftone phase shift mask of claim 13.

15. A halftone phase shift mask blank comprising a substrate which is transparent to exposure light and a halftone phase shift film thereon having a preselected phase difference and transmittance, said halftone phase shift film being composed of a single layer or multiple layers, wherein at least one layer of said halftone phase shift film comprises silicon and a plurality of metal elements as constituent elements, the content of silicon is 95 to 99 atom % based on the total of silicon and said metal elements, the plurality of metal elements consist of a first metal component of molybdenum and a second metal component of zirconium, hafnium or both, and an atomic ratio of the first metal component to the second metal component is up to 6.

16. The halftone phase shift mask blank of claim 15, wherein the first metal component and the second metal component are up to 4.3 atom %, and at least 0.15 atom %, respectively, based on the total of silicon and the first and second metal components, provided that the total is 100 atom %.

17. The halftone phase shift mask blank of claim 15, wherein said at least one layer comprising silicon and a plurality of metal elements further comprises at least one element selected from the group consisting of hydrogen, oxygen, nitrogen, carbon and halogen, as a constituent element.

18. A halftone phase shift mask adapted for KrF excimer laser, ArF excimer laser or $F_2$ laser exposure, the mask being obtained by patterning the halftone phase shift film in the phase shift mask blank of claim 15.

19. A pattern transfer method comprising exposing a photoresist to a pattern of light through the halftone phase shift mask of claim 18.

20. A halftone phase shift mask blank comprising a substrate which is transparent to exposure light and a halftone phase shift film thereon having a preselected phase difference and transmittance, wherein said halftone phase shift film has a multilayer structure including in alternate formation at least one light-shielding layer for mainly adjusting transmittance and at least one transparent layer for mainly adjusting phase difference, with the outermost surface layer being a transparent layer, said light-shielding layer comprising silicon, a first metal component of molybdenum, a second metal component of zirconium or hafnium or both, and a light element component of oxygen or nitrogen or both, as constituent elements, said transparent layer comprising silicon, the first metal component, the second metal component, and a light element component of oxygen or nitrogen or both, as constituent elements, and said multiple layers are laid up such that an atomic ratio of the light element component to the sum of silicon, first and second metal components, and light element component increases from a side adjacent the substrate toward a side remote from the substrate.

21. The halftone phase shift mask blank of claim 20, wherein said transparent layer comprises silicon, the first metal component, and the second metal component as constituent elements.

22. The halftone phase shift mask blank of claim 21, wherein the multiple layers of the halftone phase shift film are laid up such that an atomic ratio of the sum of first and second metal components to silicon decreases from a side adjacent the substrate toward a side remote from the substrate.

23. The halftone phase shift mask blank of claim 21, wherein the multiple layers of the halftone phase shift film each further comprise a light element component of oxygen or nitrogen or both and are laid up such that an atomic ratio of the light element component to the sum of silicon, first and second metal components, and light element component increases from a side adjacent the substrate toward a side remote from the substrate.

24. The halftone phase shift mask blank of claim 20, wherein the multiple layers of the halftone phase shift film are laid up such that the extinction coefficient of the layers decreases from a side adjacent the substrate toward a side remote from the substrate.

25. The halftone phase shift mask blank of claim 20, wherein the multiple layers of the halftone phase shift film are laid up such that the electric conductivity of the layers decreases from a side adjacent the substrate toward a side remote from the substrate.

26. The halftone phase shift mask blank of claim 20, wherein the multiple layers of the halftone phase shift film are laid up such that the etching rate with fluorine-based gas of the layers increases from a side adjacent the substrate toward a side remote from the substrate and the etching rate with chlorine-based gas of the layers decreases from a side adjacent the substrate toward a side remote from the substrate.

27. A halftone phase shift mask adapted for KrF excimer laser, ArF excimer laser or $F_2$ laser exposure, the mask being obtained by patterning the halftone phase shift film in the phase shift mask blank of claim 20.

28. A pattern transfer method comprising exposing a photoresist to a pattern of light through the halftone phase shift mask of claim 27.

* * * * *